United States Patent
Nguyen et al.

(10) Patent No.: US 11,393,661 B2
(45) Date of Patent: *Jul. 19, 2022

(54) REMOTE MODULAR HIGH-FREQUENCY SOURCE

(71) Applicant: Applied Materials, Inc., Santa Clara, CA (US)

(72) Inventors: Hanh Nguyen, San Jose, CA (US); Thai Cheng Chua, Cupertino, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 249 days.

This patent is subject to a terminal disclaimer.

(21) Appl. No.: 15/958,478

(22) Filed: Apr. 20, 2018

(65) Prior Publication Data

US 2019/0326098 A1    Oct. 24, 2019

(51) Int. Cl.
*H01J 37/32* (2006.01)
*H01L 21/683* (2006.01)

(52) U.S. Cl.
CPC .... *H01J 37/32238* (2013.01); *H01J 37/3244* (2013.01); *H01J 37/32201* (2013.01); *H01J 37/32311* (2013.01); *H01J 37/32724* (2013.01); *H01J 37/32935* (2013.01); *H01J 2237/334* (2013.01); *H01J 2237/335* (2013.01);
(Continued)

(58) Field of Classification Search
USPC ...... 118/723 MW, 723 I; 156/345.41, 345.48
See application file for complete search history.

(56) References Cited

U.S. PATENT DOCUMENTS

| 5,134,965 A | 8/1992 | Tokuda et al. |
| 5,179,264 A | 1/1993 | Cuomo et al. |
| 5,180,436 A | 1/1993 | Ueda et al. |

(Continued)

FOREIGN PATENT DOCUMENTS

| JP | 2005064063 | * | 3/2005 |
| WO | WO 2013/114870 | | 8/2013 |

(Continued)

OTHER PUBLICATIONS

Machine Translation JP2005064063_ITA (Year: 2005).*

(Continued)

*Primary Examiner* — Rudy Zervigon
(74) *Attorney, Agent, or Firm* — Schwabe, Williamson & Wyatt, P.C.

(57) ABSTRACT

Embodiments described herein include a processing tool that comprises a processing chamber, a chuck for supporting a substrate in the processing chamber, a dielectric window forming a portion of the processing chamber, and a modular high-frequency emission source. In an embodiment, the modular high-frequency emission source comprises a plurality of high-frequency emission modules. In an embodiment, each high-frequency emission module comprises, an oscillator module, amplification module, and an applicator. In an embodiment, the amplification module is coupled to the oscillator module. In an embodiment, the applicator is coupled to the amplification module. In an embodiment, the applicator is positioned proximate to the dielectric window.

15 Claims, 15 Drawing Sheets

(52) U.S. Cl.
CPC ............... *H01J 2237/3321* (2013.01); *H01J 2237/3323* (2013.01); *H01L 21/6831* (2013.01)

(56) References Cited

U.S. PATENT DOCUMENTS

| | | | |
|---|---|---|---|
| 5,961,871 A | 10/1999 | Bible et al. | |
| 6,109,208 A | 8/2000 | Tsuchihashi et al. | |
| 6,158,383 A | 12/2000 | Watanabe et al. | |
| 6,162,323 A * | 12/2000 | Koshimizu | H01J 37/3244 156/345.26 |
| 6,204,603 B1 | 3/2001 | Spitzi et al. | |
| 6,263,830 B1 | 7/2001 | Kamarehi et al. | |
| 6,358,361 B1 | 3/2002 | Matsumoto | |
| 6,741,944 B1 | 5/2004 | Verdeyen et al. | |
| 8,308,898 B2 | 11/2012 | Kasai et al. | |
| 9,245,741 B2 | 1/2016 | Karakawa | |
| 9,281,154 B2 | 3/2016 | Ikeda et al. | |
| 9,478,410 B2 | 10/2016 | Kamada et al. | |
| 10,943,768 B2 * | 3/2021 | Nguyen | H01J 37/3244 |
| 2004/0007983 A1 | 1/2004 | Sirkis et al. | |
| 2004/0011465 A1 * | 1/2004 | Matsumoto | H01J 37/32192 156/345.41 |
| 2005/0173069 A1 | 8/2005 | Tolmachev et al. | |
| 2006/0081624 A1 * | 4/2006 | Takada | H05B 6/686 219/716 |
| 2006/0137613 A1 * | 6/2006 | Kasai | H01J 37/32192 118/723 MW |
| 2006/0213444 A1 * | 9/2006 | Samukawa | C23C 16/5096 118/723 ME |
| 2009/0159214 A1 * | 6/2009 | Kasai | H01J 37/3222 156/345.41 |
| 2009/0194508 A1 | 8/2009 | Ui et al. | |
| 2009/0242130 A1 * | 10/2009 | Tian | H01J 37/3244 156/345.41 |
| 2010/0074807 A1 | 3/2010 | Bulkin et al. | |
| 2010/0207528 A1 * | 8/2010 | Choi | H01J 37/32192 315/111.21 |
| 2011/0061814 A1 | 3/2011 | Ikeda | |
| 2011/0174778 A1 | 7/2011 | Sawada et al. | |
| 2011/0195201 A1 | 8/2011 | Zhu et al. | |
| 2013/0112352 A1 * | 5/2013 | Hirayama | H01J 37/32266 156/345.41 |
| 2013/0284370 A1 | 10/2013 | Collins et al. | |
| 2014/0002196 A1 | 1/2014 | Leek | |
| 2014/0102367 A1 * | 4/2014 | Ishibashi | H01J 37/3244 118/723 ME |
| 2014/0197761 A1 | 7/2014 | Grandemenge et al. | |
| 2014/0203821 A1 * | 7/2014 | Yamamoto | H01J 37/32917 324/654 |
| 2014/0225504 A1 * | 8/2014 | Kaneko | H01J 37/32192 315/111.21 |
| 2014/0262042 A1 | 9/2014 | Funk et al. | |
| 2014/0283780 A1 | 9/2014 | Smith et al. | |
| 2015/0007774 A1 | 1/2015 | Iwasaki et al. | |
| 2015/0056107 A1 * | 2/2015 | Hancock | H05H 1/46 422/186 |
| 2015/0144265 A1 | 5/2015 | Fujino et al. | |
| 2015/0206778 A1 | 7/2015 | Shimomura | |
| 2015/0211124 A1 | 7/2015 | Nozawa et al. | |
| 2015/0232993 A1 | 8/2015 | Iwao et al. | |
| 2015/0279627 A1 | 10/2015 | Iwasaki et al. | |
| 2015/0371828 A1 | 12/2015 | Stowell | |
| 2015/0380216 A1 * | 12/2015 | Jang | H01J 37/32192 156/345.41 |
| 2016/0189950 A1 | 6/2016 | Oyama et al. | |
| 2016/0322218 A1 | 11/2016 | Fukiaqe et al. | |
| 2017/0133202 A1 | 5/2017 | Berry, III | |
| 2018/0127880 A1 | 5/2018 | Kotani et al. | |
| 2018/0218883 A1 | 8/2018 | Iwao | |
| 2018/0277339 A1 | 9/2018 | Kaneko et al. | |

FOREIGN PATENT DOCUMENTS

| | | |
|---|---|---|
| WO | WO 2013/122043 | 8/2013 |
| WO | WO 2014/017132 | 1/2014 |
| WO | WO 2016/089424 | 6/2016 |

OTHER PUBLICATIONS

International Search Report and Written Opinion from PCT/US2017/013984 dated May 1, 2017, 10 pgs.
International Search Report and Written Opinion from PCT/US2018/022044 dated Jun. 29, 2018, 11 pgs.
International Search Report and Written Opinion from PCT/US2018/026330 dated Jul. 26, 2018, 12 pgs.
Non-Final Office Action from U.S. Appl. No. 15/238,695 dated Jan. 25, 2019, 30 pgs.
International Preliminary Report on Patentability from PCT/US2017/013984 dated Feb. 19, 2019, 15 pgs.
Non-Final Office Action from U.S. Appl. No. 15/485,217 dated May 15, 2019, 23 pgs.
Non-Final Office Action from U.S. Appl. No. 15/238,695 dated Jul. 5, 2019, 25 pgs.
International Preliminary Report on Patentability from PCT/US2018/022044 dated Oct. 24, 2019, 8 pgs.
International Preliminary Report on Patentability from PCT/US2018/026330 dated Nov. 21, 2019, 9 pgs.
Final Office Action from U.S. Appl. No. 15/485,217 dated Oct. 30, 2019, 20 pgs.

* cited by examiner

REMOTE MODULAR HIGH-FREQUENCY SOURCE

BACKGROUND

1) Field

Embodiments relate to the field of high-frequency emission sources and, in a particular embodiment, to a modular high-frequency emission source that is used in a remote plasma processing tool.

2) Description of Related Art

Use of high-frequency radiation systems, including for use in plasma processing is used extensively in the manufacture of many different technologies, such as those in the semiconductor industry, display technologies, microelectromechanical systems (MEMS), and the like. Currently, radio frequency (RF) generated plasmas with a single antenna are most often used. However, in the case of plasmas generated with a higher frequencies, including microwave frequencies, a plasmas with higher plasma density and/or a plasma with a high concentration of excited neutral species are formed. Unfortunately, high-frequency radiation systems which are generated from a single antenna, for example those used to form plasmas, suffer their own drawbacks.

Typical high-frequency radiation systems, for example those to form a microwave plasma, use a singular, large source of high-frequency or microwave radiation (e.g., a magnetron) and a transmission path for guiding the high-frequency radiation from the magnetron to the processing chamber. For example, in typical high power microwave applications in the semiconductor industry, the transmission path is a high-frequency waveguide. Waveguides are used because outside of a waveguide designed to carry the specific frequency of the high-frequency source, the high-frequency power attenuates rapidly with distance. Additional components, such as tuners, couplers, mode transformers, and the like are also required to transmit the high-frequency radiation to the processing chamber. These components limit the construction to large systems (i.e., at least as large as the sum of the waveguide and associated components), and severely limit the design. As such, the geometry of the high frequency radiation field, which may be use to form a plasma, is constrained since the geometry of the high-frequency radiation field resembles the shape of the waveguides. Accordingly, it is difficult to match the geometry of the high-frequency radiation field to the geometry of the substrate that is being processed. In particular, it is difficult to create a high-frequency radiation field at microwave frequencies, to form a plasma where the process is uniformly performed on the whole area of the substrate (e.g., 200 mm, 300 mm or larger diameter silicon wafers, glass substrates used in the display industry, or continuous substrates used in roll-to-roll manufacturing, or the like). Some high-frequency generated plasmas may use a slot line antenna to allow the high-frequency energy to be spread over an extended surface. However, such systems are complicated, require specific geometry, and are limited in the power density that can be coupled to the plasma.

Furthermore, high-frequency radiation systems typically generate plasmas that are not highly uniform and/or are not able to have a spatially tunable density. As the substrates that are being processed continue to increase in size, it becomes increasingly difficult to account for edge effects. Additionally, the inability to tune the plasma limits the ability to modify processing recipes to account for incoming substrate nonuniformity and adjust the plasma density for processing systems in which a nonuniformity is required to compensate for the design of the processing system (e.g., to accommodate the nonuniform radial velocity of the rotating wafers in some processing chambers).

SUMMARY

Embodiments described herein include a processing tool that comprises a processing chamber, a chuck for supporting a substrate in the processing chamber, a dielectric window forming a portion of the processing chamber, and a modular high-frequency emission source. In an embodiment, the modular high-frequency emission source comprises a plurality of high-frequency emission modules. In an embodiment, each high-frequency emission module comprises, an oscillator module, amplification module, and an applicator. In an embodiment, the amplification module is coupled to the oscillator module. In an embodiment, the applicator is coupled to the amplification module. In an embodiment, the applicator is positioned proximate to the dielectric window.

Embodiments described herein include a processing tool that comprises a processing chamber, a chuck for supporting a substrate in the processing chamber, a dielectric window forming a portion of the processing chamber, and a modular high-frequency emission source that comprises a plurality of high-frequency emission modules. In an embodiment, each high-frequency emission module comprises an oscillator module, an amplification module, and an applicator. In an embodiment the oscillator module comprises a voltage control circuit, and a voltage controlled oscillator. In an embodiment, an output voltage from the voltage control circuit drives oscillation in the voltage controlled oscillator to generate an output high-frequency electromagnetic radiation. In an embodiment, the amplification module is coupled to the oscillator module. In an embodiment, the amplification module amplifies the output high-frequency electromagnetic radiation from the voltage controlled oscillator. In an embodiment, the applicator is coupled to the amplification module. In an embodiment, the applicator is positioned proximate to the dielectric window.

Embodiments described herein include a processing tool that comprises a main processing chamber, a chuck for supporting a substrate in the main processing chamber, an ante chamber that is fluidically coupled to the main processing chamber, and a dielectric window that forms a portion of the antechamber, and a modular high-frequency emission source. In an embodiment, the modular high-frequency emission source comprises a plurality of high-frequency emission modules. In an embodiment, each high-frequency emission module comprises, an oscillator module, amplification module, and an applicator. In an embodiment, the amplification module is coupled to the oscillator module. In an embodiment, the applicator is coupled to the amplification module. In an embodiment, the applicator is positioned proximate to the dielectric window.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Figure 1:
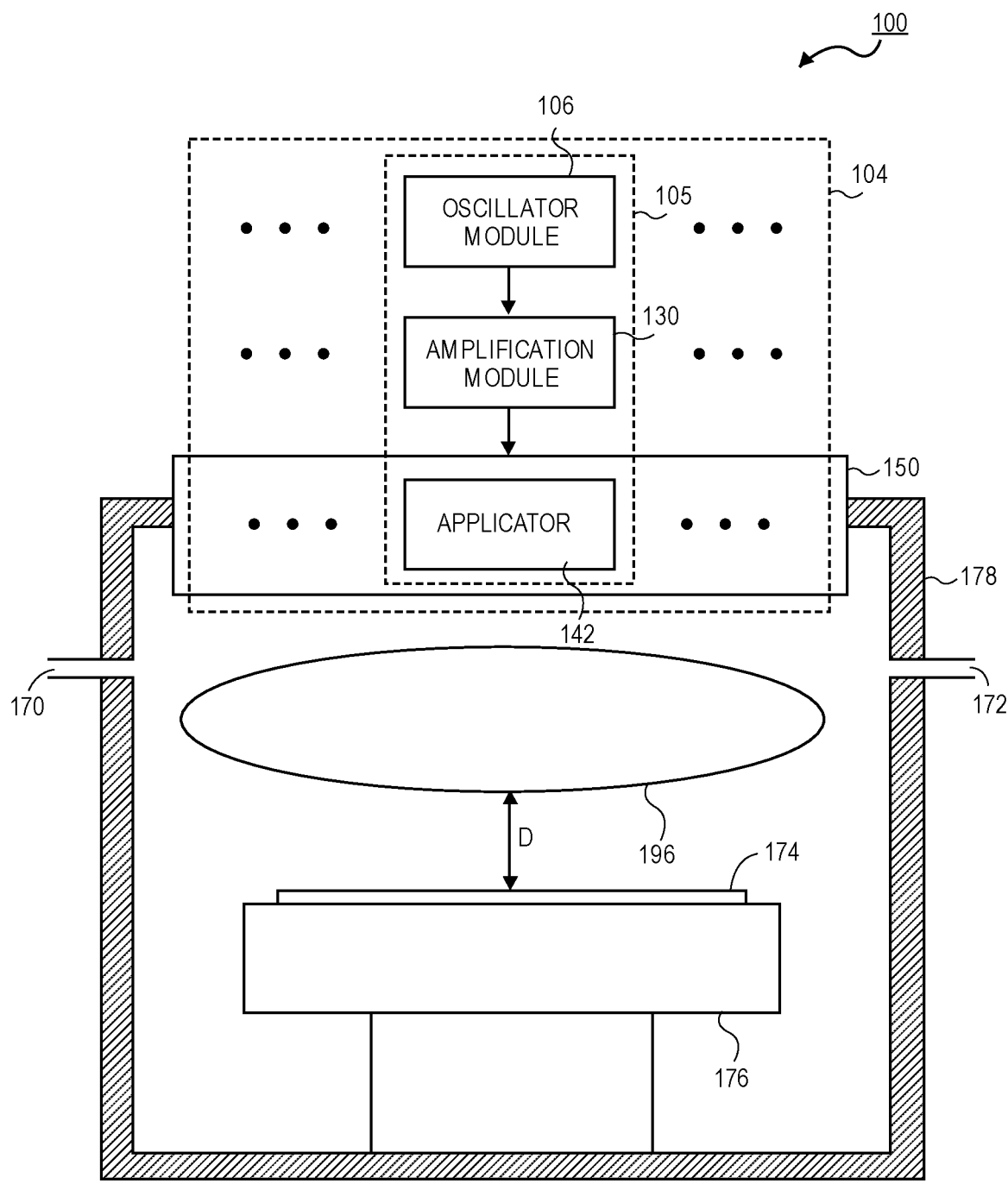
FIG. 1 is a schematic diagram of a processing tool that includes a modular high-frequency emission source, in accordance with an embodiment.

Devices in accordance with embodiments described herein include a modular high-frequency emission source that is used in a remote plasma processing tool. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Embodiments include a modular high-frequency emission source that comprises an array of high-frequency emission modules. As used herein, "high-frequency" electromagnetic radiation include radio frequency radiation, very-high-frequency radiation, ultra-high-frequency radiation, and microwave radiation. "High-frequency" may refer to frequencies between 0.1 MHz and 300 GHz. According to an embodiment, each high-frequency emission module comprises an oscillator module, an amplification module, and an applicator. In an embodiment, the applicator couples the high-frequency radiation into a remote plasma processing tool in order to generate a remote plasma. The use of a plurality of high-frequency emission modules allows for the applicators to be arranged in different configurations in order to match the needs of a processing tool. In some embodiments, the applicators may be positioned on, in, or through a dielectric window. Embodiments include dielectric windows that are planar and non-planar.

As used herein, a "remote plasma" refers to a plasma that is spaced away from the substrate being processed by at least three times the Debye length for the plasma. Separating the remote plasma from the substrate being processed by at least three times the Debye length generates an ion population at the surface of the substrate that is negligible, while still allowing for radicals generated in the plasma to diffuse to the substrate.

In an embodiment, the remote plasma may be physically separated from the substrate being processed. For example, the remote plasma may be generated in an antechamber that is fluidically coupled to the main processing volume of the chamber. In additional embodiments, the remote plasma may be generated in a plasma portion of the processing chamber that is separated from the main processing chamber by one or more physical separators.

Forming a remote plasma source from a plurality of high-frequency emission modules provides several advantages. For example, the remote plasma will be spatially tunable. Additionally, the plasma will be non-contaminating because the potentials needed for such a tool are less than the sputtering threshold of the chamber materials. Furthermore, a remote high-frequency plasma source is a more power efficient way to generate a sufficient flux of radicals for processing than an RF remote plasma source.

In an embodiment, the oscillator module and the amplification module comprise electrical components that are all solid state electronic components. The use of solid state electronics instead of for example, a magnetron, allows for a significant reduction in the size and the complexity of the high-frequency plasma source. Particularly, the solid state components are much smaller than the magnetron hardware described above. Additionally, the use of solid state components allows for the elimination of bulky waveguides needed to transmit the high-frequency radiation to the processing chamber. Instead, the high-frequency radiation may be transmitted with coaxial cabling. The elimination of waveguides also allows for the construction of a large area modular high-frequency emission source where the size of the plasma formed is not limited by the size of waveguides. Instead, an array of high-frequency emission modules may be constructed in a given pattern that allows for the formation of a plasma that is arbitrarily large (and arbitrarily shaped) to match the shape of any substrate. Furthermore, the cross-sectional shape of the applicators may be chosen so that the array of applicators may be packed together as tightly as possible (i.e., a closed-packed array).

The use of an array of high-frequency emission modules also provides greater flexibility in the ability to locally change the plasma density by independently changing the power settings of the amplification module for each high-frequency emission module. This allows for uniformity optimization during plasma processing, such as adjustments made for wafer edge effects, adjustments made for incoming wafer nonuniformity, and the ability to adjust the plasma density for processing systems in which a nonuniformity is needed to compensate for the design of the processing system (e.g., to accommodate the nonuniform radial velocity of the rotating wafers in some processing chambers).

Additional embodiments may also include one or more plasma monitoring sensors. Such embodiments provide a way to measure the density of the plasma (or any other plasma property) locally by each applicator, and to use that measurement as part of a feedback loop to control the power applied to each high-frequency emission module. Accordingly, each high-frequency emission module may have independent feedback, or a subset of the high-frequency emission modules in the array may be grouped in zones of control where the feedback loop controls the subset of high-frequency emission modules in the zone.

In addition to the enhanced tuneability of the plasma, the use of individual high-frequency emission modules provides a greater power density than are currently available in existing plasma sources. For example, high-frequency emission modules may allow for a power density that is approximately five or more times greater than typical RF plasma processing systems. For example, typical power into a plasma enhanced chemical vapor deposition process is approximately 3,000 W, and provides a power density of approximately 4 W/cm$^2$ for a 300 mm diameter wafer. In contrast, high-frequency emission modules according to embodiments may use a 300 W power amplifier with a 4 cm diameter applicator, to provide a power density of approximately 24 W/cm$^2$ at an applicator packing density of approximately 1. At an applicator packing density of ⅓ and with use of a 1000 W power amplifier, a power density of 27 W/cm$^2$ is provided. At an applicator packing density of 1 and with use of a 1000 W power amplifier, a power density of 80 W/cm$^2$ is provided.

Usual approaches for making high-frequency emission plasmas (e.g., microwave plasmas) involve the use of a single oscillator module and a single electrode or applicator to couple the high-frequency energy to the gas to form the plasma. However, using multiple electrode/applicator structures with a single oscillator module that is split to power each of the multiple electrodes/applicators has drawbacks. Particularly, an interference pattern will necessarily form because the electromagnetic radiation generated by single oscillator module results in electromagnetic radiation emitted by each applicator to be at the same frequency and at a fixed phase with each other. The interference pattern produces local maxima and minima that result in a non-uniform plasma.

Accordingly, embodiments include an array of high-frequency emission modules with each high-frequency emission module having its own oscillator module. When a plurality of oscillator modules are used, the electromagnetic radiation generated by a first oscillator module may not interfere with the electromagnetic radiation generated by a second oscillator module because the first and second oscillator modules may not be at the same frequency nor have a controlled phase difference between the first and second oscillator modules. In embodiments where a plasma is formed, the plasma will have improved uniformity since there is no interference pattern.

Referring now to FIG. 1, a cross-sectional illustration of a remote plasma processing tool 100 is shown, according to an embodiment. In some embodiments, the processing tool 100 may be a processing tool suitable for any type of processing operation that utilizes a plasma. For example, the processing tool 100 may be a processing tool used for plasma enhanced chemical vapor deposition (PECVD), plasma enhanced atomic layer deposition (PEALD), etch and selective removal processes, and plasma cleaning.

Generally, embodiments include a processing tool 100 that includes a chamber 178. In processing tools 100, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that the processing tool 100 may include a showerhead for evenly distributing the processing gases over a substrate 174.

In an embodiment, the substrate 174 may be supported on a chuck 176. For example, the chuck 176 may be any suitable chuck, such as an electrostatic chuck. The chuck may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes a modular high-frequency emission source 104. The modular high-frequency emission source 104 may comprise an array of high-frequency emission modules 105. In an embodiment, each high-frequency emission module 105 may include an oscillator module 106, an amplification module 130, and an applicator 142. In an embodiment, the oscillator module 106 and the amplification module 130 may comprise electrical components that are solid state electrical components. In an embodiment, each of the plurality of oscillator modules 106 may be communicatively coupled to different amplification modules 130. In some embodiments, there may be a 1:1 ratio between oscillator modules 106 and amplification modules 130. For example, each oscillator module 106 may be electrically coupled to a single amplification module 130. In an embodiment, the plurality of oscillator modules 106 may generate incoherent electromagnetic radiation. Accordingly, the electromagnetic radiation induced in the chamber 178 will not interact in a manner that results in an undesirable interference pattern.

In an embodiment, each oscillator module 106 generates electromagnetic radiation that is transmitted to the amplification module 130. After processing by the amplification module 130, the electromagnetic radiation is transmitted to the applicator 142. According to an embodiment, an array of applicators 142 are coupled to the chamber 178 are positioned over, in, or through a dielectric window 150. In an embodiment, the applicators 142 each emit electromagnetic radiation into the chamber 178. In some embodiments, the applicators 142 couple the electromagnetic radiation to the processing gasses in the chamber 178 to produce a plasma 196. In an embodiment, the plasma 196 is a remote plasma. Particularly, the plasma 196 may be spaced away from the substrate 174 by a distance D that is at least three times the Debye length of the plasma 196.

Figure 2A:
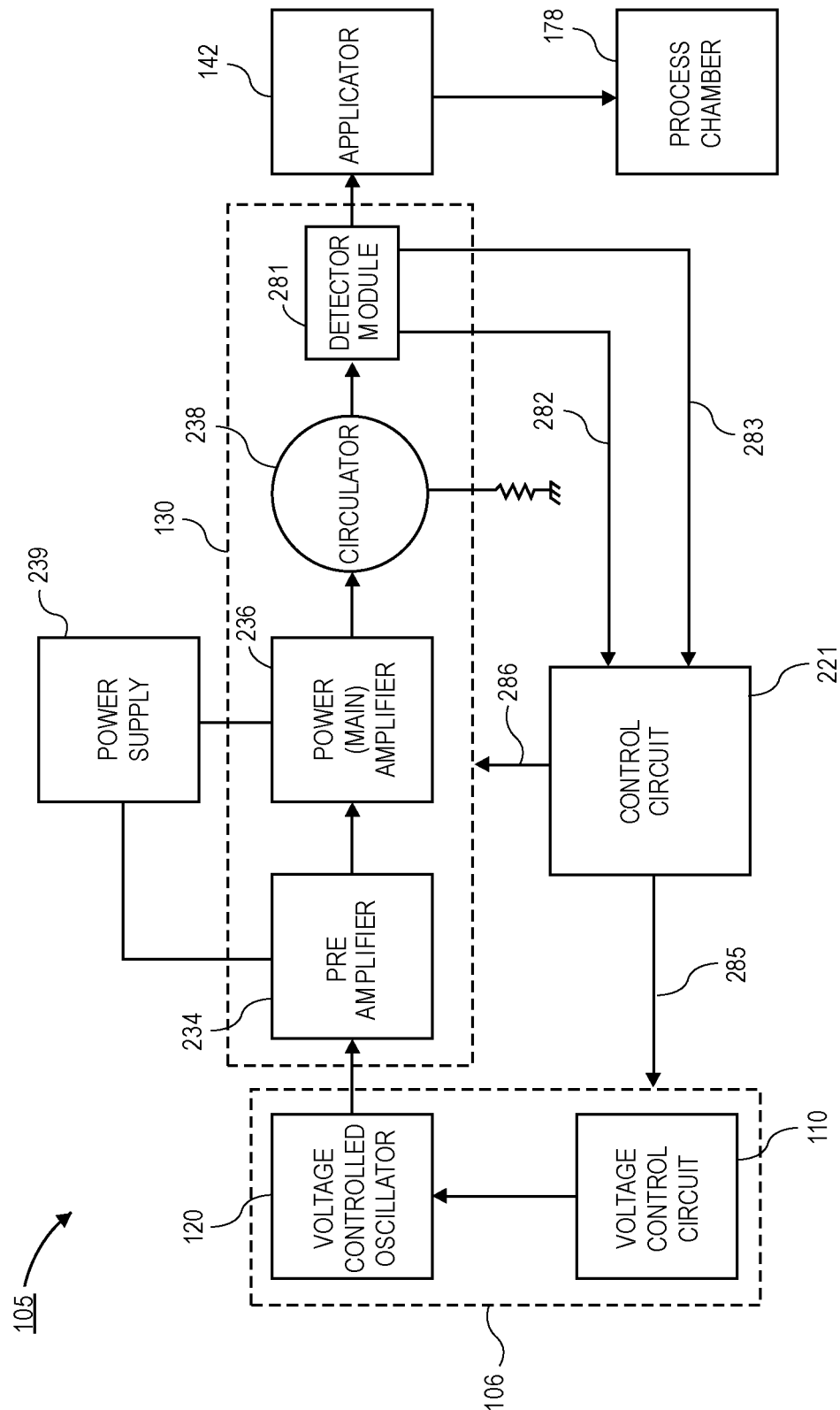
FIG. 2A is a schematic block diagram of a solid state high-frequency emission module, in accordance with an embodiment.

Referring now to FIG. 2A, a schematic block diagram of the electronics in a high-frequency emission module 105 in the modular high-frequency emission source 104 is shown, according to an embodiment. In an embodiment, each oscillator module 106 includes a voltage control circuit 110 for providing an input voltage to a voltage controlled oscillator 120 in order to produce high-frequency electromagnetic radiation at a desired frequency. Embodiments may include an input voltage between approximately 1V and 10V DC. The voltage controlled oscillator 120 is an electronic oscillator whose oscillation frequency is controlled by the input voltage. According to an embodiment, the input voltage from the voltage control circuit 110 results in the voltage controlled oscillator 120 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz. In an embodiment, one or more of the plurality of oscillator modules 106 may emit electromagnetic radiation at different frequencies.

According to an embodiment, the electromagnetic radiation is transmitted from the voltage controlled oscillator 120 to the amplification module 130. The amplification module 130 may include a driver/pre-amplifier 234, and a main power amplifier 236 that are each coupled to a power supply 239. According to an embodiment, the amplification module 130 may operate in a pulse mode. For example, the amplification module 130 may have a duty cycle between 1% and 99%. In a more particular embodiment, the amplification module 130 may have a duty cycle between approximately 15% and 50%.

In an embodiment, the electromagnetic radiation may be transmitted to the applicator 142 after being processed by the amplification module 130. However, part of the power transmitted to the applicator 142 may be reflected back due to the mismatch in the output impedance. Accordingly, some embodiments include a detector module 281 that allows for the level of forward power 283 and reflected power 282 to be sensed and fed back to the control circuit module 221. It is to be appreciated that the detector module 281 may be located at one or more different locations in the system. In an embodiment, the control circuit module 221 interprets the reflected power 282 and the forward power 283, and determines the level for the control signal 285 that is communicatively coupled to the oscillator module 106, and the level for the control signal 286 that is communicatively coupled to the amplifier module 130. In an embodiment, control signal 285 adjusts the oscillator module 106 to optimize the high-frequency radiation coupled to the amplification module 130. In an embodiment control signal 286 adjusts the amplification module 130 to optimize the output power couple to the applicator 142.

In an embodiment, the feedback control of the oscillator module 106 and the amplification module 130 may allow for the level of the reflected power to be less than approximately 5% of the forward power. In some embodiments, the feedback control of the oscillator module 106 and the amplification module 130 may allow for the level of the reflected power to be less than approximately 2% of the forward power. Accordingly, embodiments allow for an increased percentage of the forward power to be coupled into the processing chamber 178, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 120.

Figure 2B:
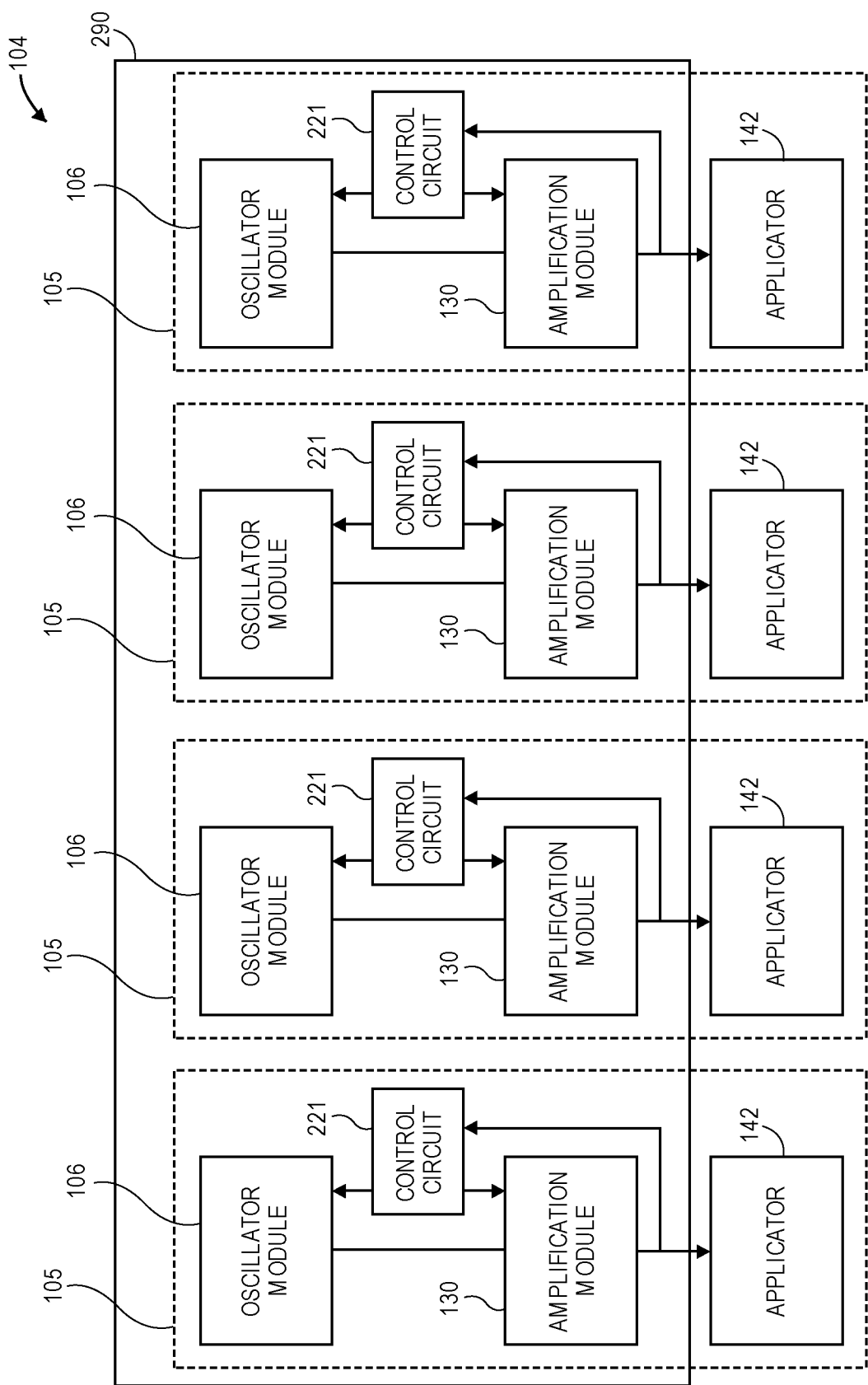
FIG. 2B is a schematic block diagram of a portion of the electronics of a processing tool with a modular high-frequency emission source that includes incoherent oscillator modules and feedback control, in accordance with an embodiment.

Referring now to FIG. 2B, a schematic of a portion of the solid state electronics of a modular high-frequency emission source 104 with an array of high-frequency emission modules 105 is shown, in accordance with an embodiment. In the illustrated embodiment, each high-frequency emission module 105 includes an oscillator module 106 that is communicatively coupled to a different amplification module 130. Each of the amplification modules 130 may be coupled to different applicators 142. In an embodiment, a control circuit module 221 may be communicatively coupled to the oscillator module 106 and the amplification module 130.

In the illustrated embodiment, each of the oscillator modules 106 and the amplification modules 130 are formed on a single board 290, such as a printed circuit board (PCB). However, it is to be appreciated that the oscillator modules 106 and the amplification module 130 may be formed on two or more different boards 290. In the illustrated embodiment four high-frequency emission modules 105 are shown. However, it is to be appreciated that the modular high-frequency emission source 104 may include two or more high-frequency emission modules 105. For example the modular high-frequency emission source 104 may include 2 or more high-frequency emission modules, 5 or more high-frequency emission modules, 10 or more high-frequency emission modules, or 25 or more high-frequency emission modules.

Figure 2C:
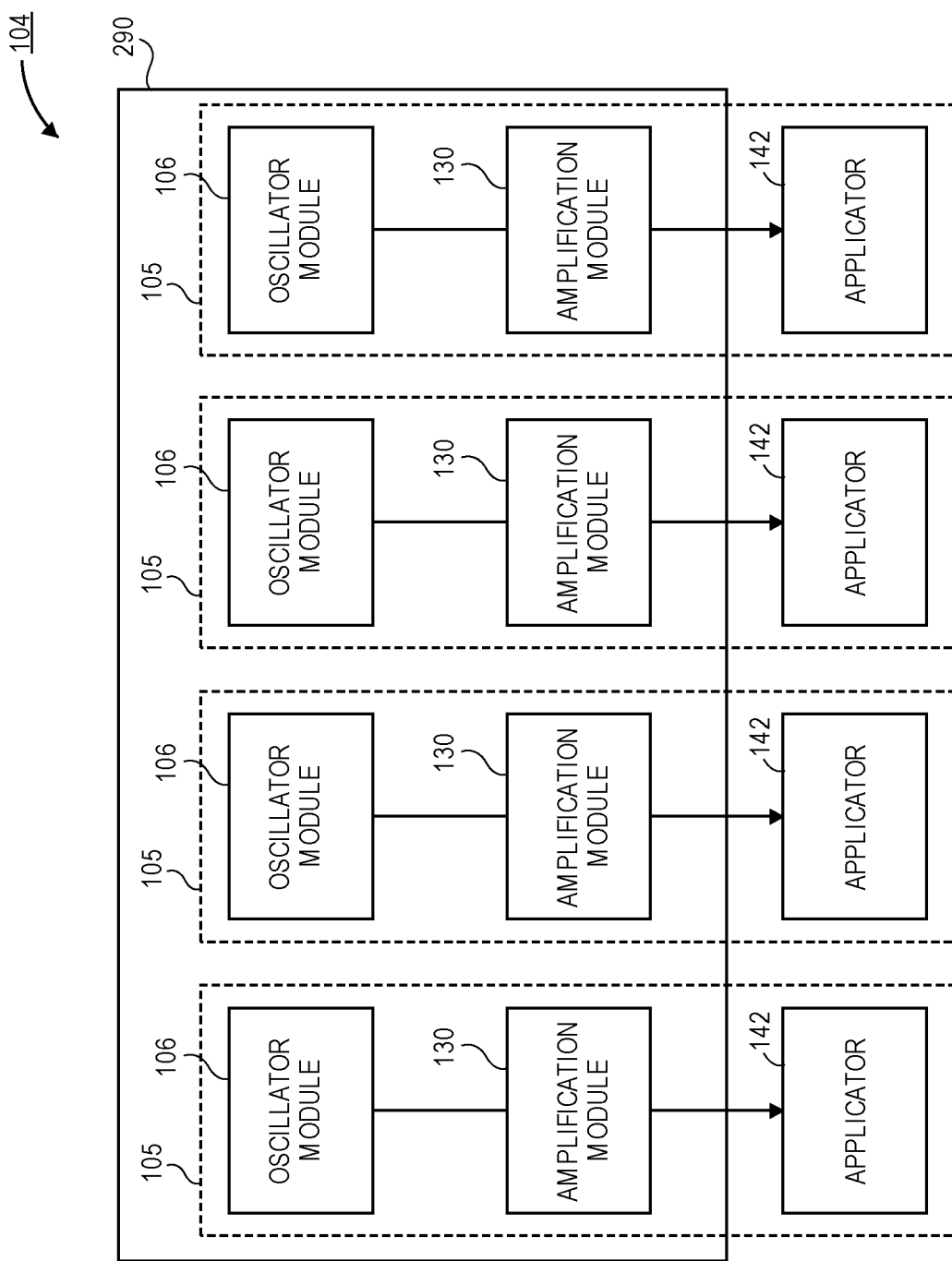
FIG. 2C is a schematic block diagram of a portion of the electronics of a processing tool with a modular high-frequency emission source that includes a plurality of oscillator modules, in accordance with an embodiment.

Referring now to FIG. 2C, a schematic of a portion of the solid state electronics of a modular high-frequency emission source 104 with an array of high-frequency emission modules 105 is shown, in accordance with an embodiment. FIG. 2C is substantially similar to the system illustrated in FIG. 2B, with the exception that the control circuit is omitted.

Particularly, in some embodiments the feedback control provided by a detector and the control circuit may not be needed.

Figure 3:
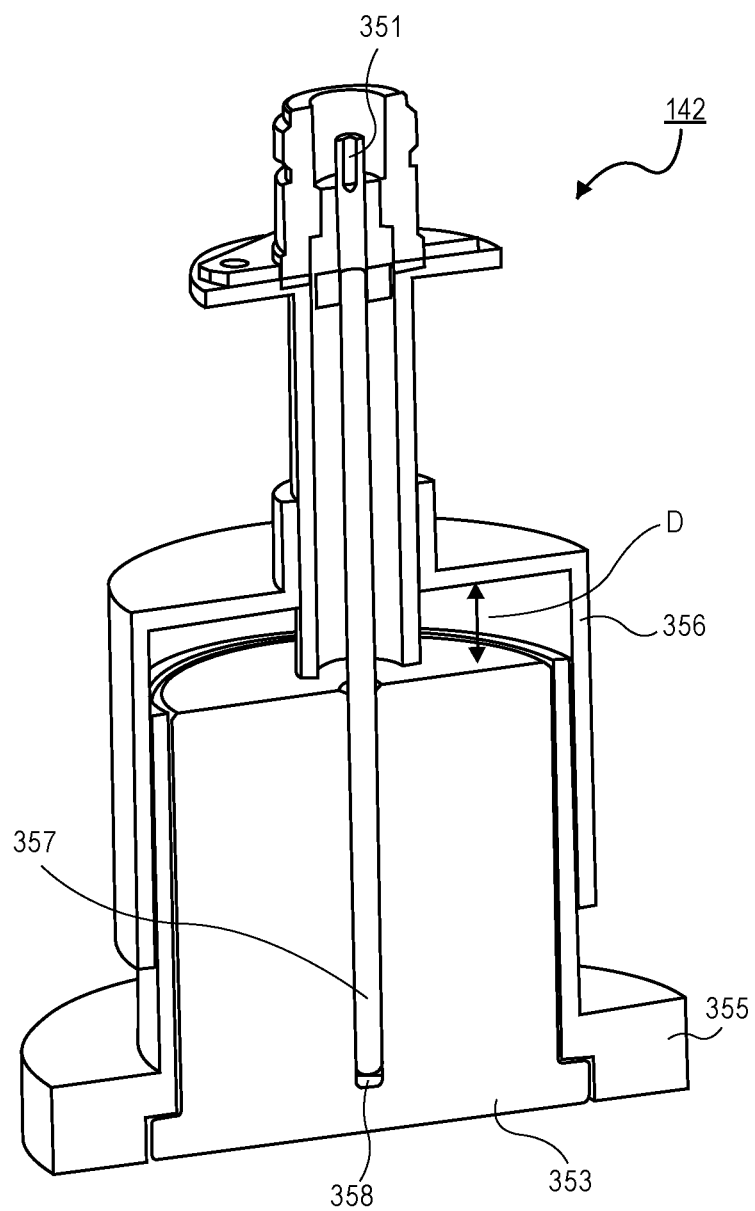
FIG. 3 is cross-sectional illustration of an applicator that may be used to couple high-frequency radiation to a processing chamber, in accordance with an embodiment.

Referring now to FIG. 3, a cut-away illustration of an applicator 142 is shown, according to an embodiment. In an embodiment, the electromagnetic radiation is transmitted to an applicator 142 by a coaxial cable 351 that couples to a monopole 357 that extends axially through the applicator 142. In an embodiment where the electromagnetic radiation is high-frequency radiation, the monopole 357 may also extend into a channel 358 formed into a center of a dielectric resonant cavity 353. The dielectric resonant cavity 353 may be a dielectric material, such as quartz, aluminum oxide, titanium oxide, or the like. Additional embodiments may also include a resonant cavity 353 that does not include a material (i.e., the dielectric resonant cavity 353 may be air or a vacuum). According to an embodiment, the dielectric resonator is dimensioned so that the dielectric resonator supports resonance of the high-frequency radiation. Generally, the size of the dielectric resonant cavity 353 is dependent on the dielectric constant of the material used to form the dielectric resonant cavity 353 and the frequency of the high-frequency radiation. For example, materials with higher dielectric constants would allow for smaller resonant cavities 353 to be formed. In an embodiment where the dielectric resonant cavity 353 includes a circular cross-section, the diameter of the dielectric resonant cavity 353 may be between approximately 1 cm and 15 cm. In an embodiment, the cross-section of the dielectric resonant cavity 353 along a plane perpendicular to the monopole 357 may be any shape, so long as the dielectric resonant cavity 353 is dimensioned to support resonance. In the illustrated embodiment, the cross-section along a plane perpendicular to the monopole 357 is circular, though other shapes may also be used, such as polygons (e.g., triangles, rectangles, etc.), symmetrical polygons (e.g., squares, pentagons, hexagons, etc.), ellipses, or the like).

In an embodiment, the cross-section of the dielectric resonant cavity 353 may not be the same at all planes perpendicular to the monopole 357. For example, the cross-section of a bottom extension proximate to the open end of the applicator housing 355 is wider than the cross-section of the dielectric resonant cavity proximate to the channel 358. In addition to having cross-sections of different dimensions, the dielectric resonant cavity 353 may have cross-sections with different shapes. For example, the portion of the dielectric resonant cavity 353 proximate to the channel 358 may have a circular shaped cross-section, whereas the portion of the dielectric resonant cavity 353 proximate to the open end of the applicator housing 355 may be a symmetrical polygon shape (e.g., pentagon, hexagon, etc.). However, it is to be appreciated that embodiments may also include a dielectric resonant cavity 353 that has a uniform cross-section at all planes perpendicular to the monopole 357.

According to an embodiment, the applicator 142 may also include an impedance tuning backshort 356. The backshort 356 may be a displaceable enclosure that slides over an outer surface of the applicator housing 355. When adjustments to the impedance need to be made, an actuator (not shown) may slide the backshort 356 along the outer surface of the applicator housing 355 to change a distance D between a surface of the backshort 356 and a top surface of the dielectric resonant cavity 353. As such, embodiments provide more than one way to adjust the impedance in the system. According to an embodiment, an impedance tuning backshort 356 may be used in conjunction with the feedback process described above to account for impedance mismatches. Alternatively, the feedback process or an impedance tuning backshort 356 may be used by themselves to adjust for impedance mismatches.

According to an embodiment, the applicator 142 functions as a dielectric antenna that directly couples the high-frequency electromagnetic field into the processing chamber 178. The particular axial arrangement of the monopole 357 entering the dielectric resonant cavity 353 may produce an TM01δ mode excitation. However different modes of excitation may be possible with different applicator arrangements. For example, while an axial arrangement is illustrated in FIG. 3, it is to be appreciated that the monopole 357 may enter the dielectric resonant cavity 353 from other orientations. In one such embodiment, the monopole 357 may enter the dielectric resonant cavity 353 laterally, (i.e., through a sidewall of the dielectric resonant cavity 353).

It is to be appreciated that the applicator 142 illustrated in FIG. 3 is exemplary in nature, and embodiments are not limited to the design described. For example, the applicator 142 in FIG. 3 is particularly suitable for emitting microwave radiation. However, embodiments may include any applicator design that is configured to emit any high-frequency electromagnetic radiation.

Figure 4A:
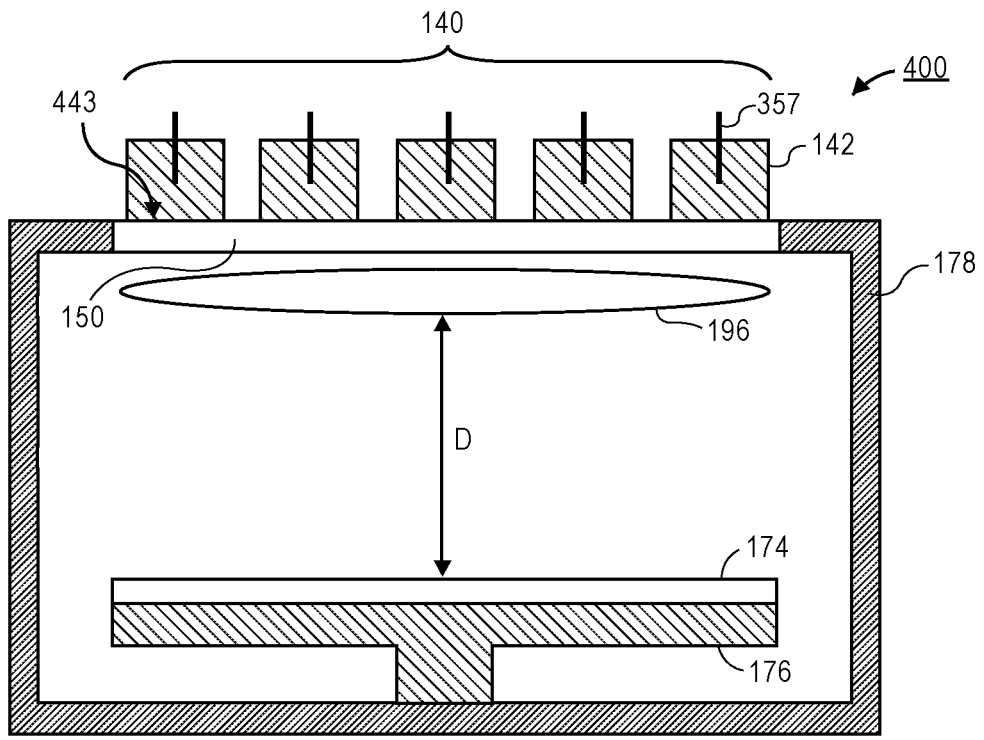
FIG. 4A is a cross-sectional illustration of a remote plasma processing tool that includes applicators that contact a dielectric window of the processing chamber, in accordance with an embodiment.

Referring now to FIG. 4A, a cross-sectional illustration of a portion of a processing tool 400 with an array 140 of applicators 142 coupled to the chamber 178 is shown, according to an embodiment. In the illustrated embodiment, the electromagnetic radiation from the applicators 142 is coupled into the chamber 178 by being positioned proximate to a dielectric window 150. As used herein, a "dielectric window" may refer to a component that is a monolithic dielectric material, or that is a composite dielectric and metallic component. For example, the dielectric window 150 may include a dielectric layer and a conductive layer. In an embodiment, the conductive layer may be a grounded, held at any other potential, or floated.

Figure 4B:
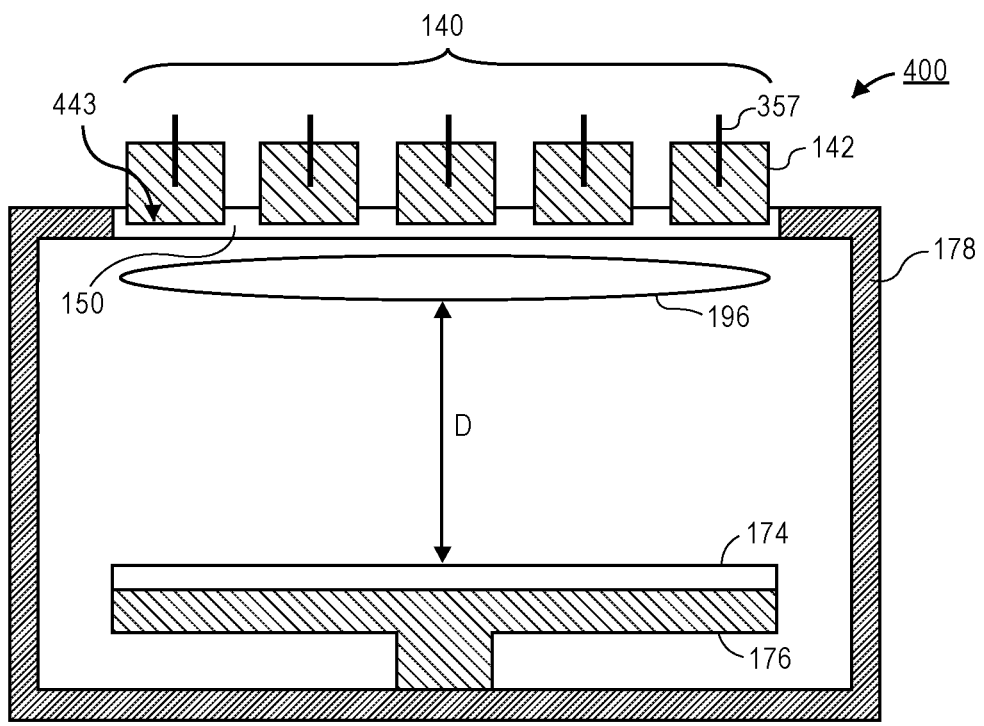
FIG. 4B is a cross-sectional illustration of a remote plasma processing tool that includes applicators that are set into cavities formed into a dielectric window of the processing chamber, in accordance with an embodiment.
Figure 4C:
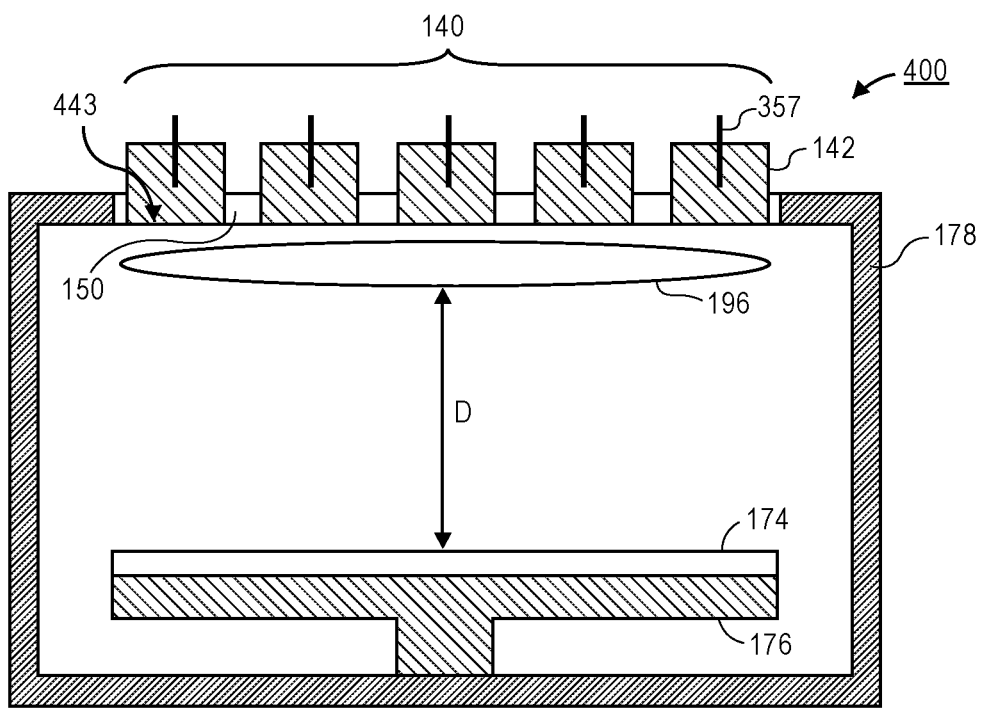
FIG. 4C is a cross-sectional illustration of a remote plasma processing tool that includes applicators that extend through a dielectric window of the processing chamber, in accordance with an embodiment.

In an embodiment, the dielectric window 150 may be integrated into the chamber 178. For example, the dielectric window 150 may be part of a chamber lid, a chamber sidewall, or any other chamber surface. The proximity of the applicators 142 to the dielectric window 150 allows for the high-frequency radiation resonating in the dielectric resonant cavity 353 (not shown in FIG. 4A) to couple with the dielectric window 150, which may then couple with processing gasses in the chamber to generate a plasma. In one embodiment, a surface 443 of each applicator 142 may be in direct contact with the dielectric window 150. In an additional embodiment, the surface 443 of each applicator may be spaced away from a surface of the dielectric window 150, so long as the high-frequency radiation can still be transferred to the dielectric window 150. In additional embodiments, the applicators 142 may be set into cavities in the dielectric window 150, as illustrated in FIG. 4B. In yet another embodiment, the applicators 142 may pass through the dielectric window 150, so that a surface 443 of each applicator 142 is exposed to the interior of the chamber 178, as illustrated in FIG. 4C. In such embodiments, a majority of the high-frequency radiation may be transmitted directly into the chamber 178 without coupling with the dielectric window 150.

According to embodiments where the applicators 142 are not formed through the dielectric window 150 (e.g., the embodiments illustrated in FIGS. 4A and 4B), the array 140 of applicators 142 may be removable from the dielectric window 150 (e.g., for maintenance, to rearrange the array of applicators to accommodate a substrate with different dimensions, or for any other reason) without needing to remove the dielectric window 150 from the chamber 178. Accordingly, the applicators 142 may be removed from the processing tool 100 without needing to release a vacuum in the chamber 178. According to an additional embodiment, the dielectric window 150 may also function as a gas injection plate or a showerhead.

In an embodiment, the applicators 142 may include any antenna design that is configured to emit any frequency of the high-frequency electromagnetic radiation. In an embodiment, the array 140 of applicators may include more than one applicator 142 design. For example, the array 140 of applicators 142 may include a first applicator for emitting a first high-frequency radiation and a second applicator for emitting a second high-frequency radiation that is different than the first high-frequency radiation.

According to an embodiment, the processing tools 400 in FIGS. 4A-4C may be considered remote plasma processing tools. The processing tools 400 may be referred to as remote plasma processing tools because the plasma 196 induced by the array 140 of applicators 142 is spaced away from the substrate 174 a distance D that is at least three times the Debye length of the plasma 196.

Figure 4D:
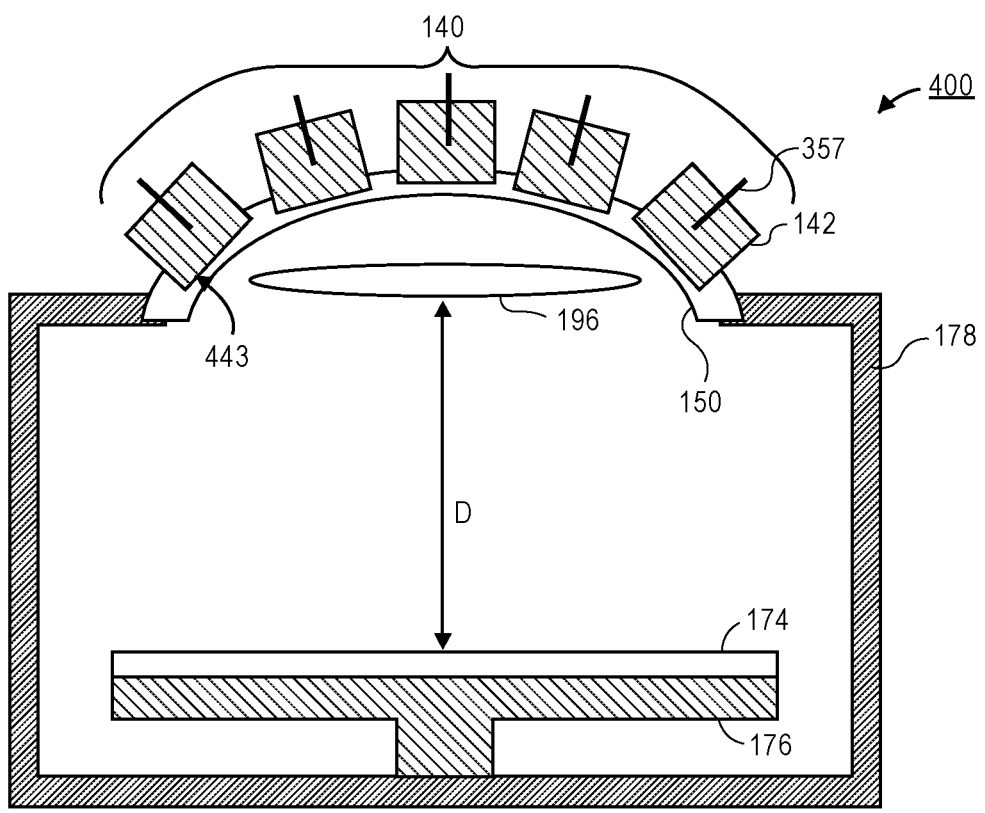
FIG. 4D is a cross-sectional illustration of a remote plasma processing tool that includes a non-planar dielectric window, in accordance with an embodiment.

Referring now to FIG. 4D, a cross-sectional illustration of a processing tool 400 with a non-planar dielectric window 150 is shown, in accordance with an embodiment. In an embodiment, the non-planar dielectric window 150 may include a three-dimensional surface (e.g., a dome, a cylinder, or a cylindrical volume with any simply connected asymmetrical or symmetrical cross-section, such as an oval, a circle, a triangle, a square, a rectangle, a pentagon, a heptagon, a septagon, etc.). In such an embodiment, the array 140 of applicators 142 may be arranged in proximity with the non-planar dielectric window 150. In the illustrated embodiment, the applicators 142 are set into cavities in the non-planar dielectric window 150. Other embodiments may include surfaces 443 of the applicators 142 that rest on a top surface of the non-planar dielectric window 150, similar to the configuration in FIG. 4A. An additional embodiment may include applicators 142 that pass entirely through the dielectric window 150 so that surfaces 443 of the applicators 142 are exposed to the interior of the chamber, similar to FIG. 4C.

In an embodiment, the processing tool 400 in FIG. 4D is a remote plasma tool due to the spacing D between a plasma 196 and the substrate 174. For example, the spacing D may be at least three times the Debye length of the plasma 196.

Figure 4E:
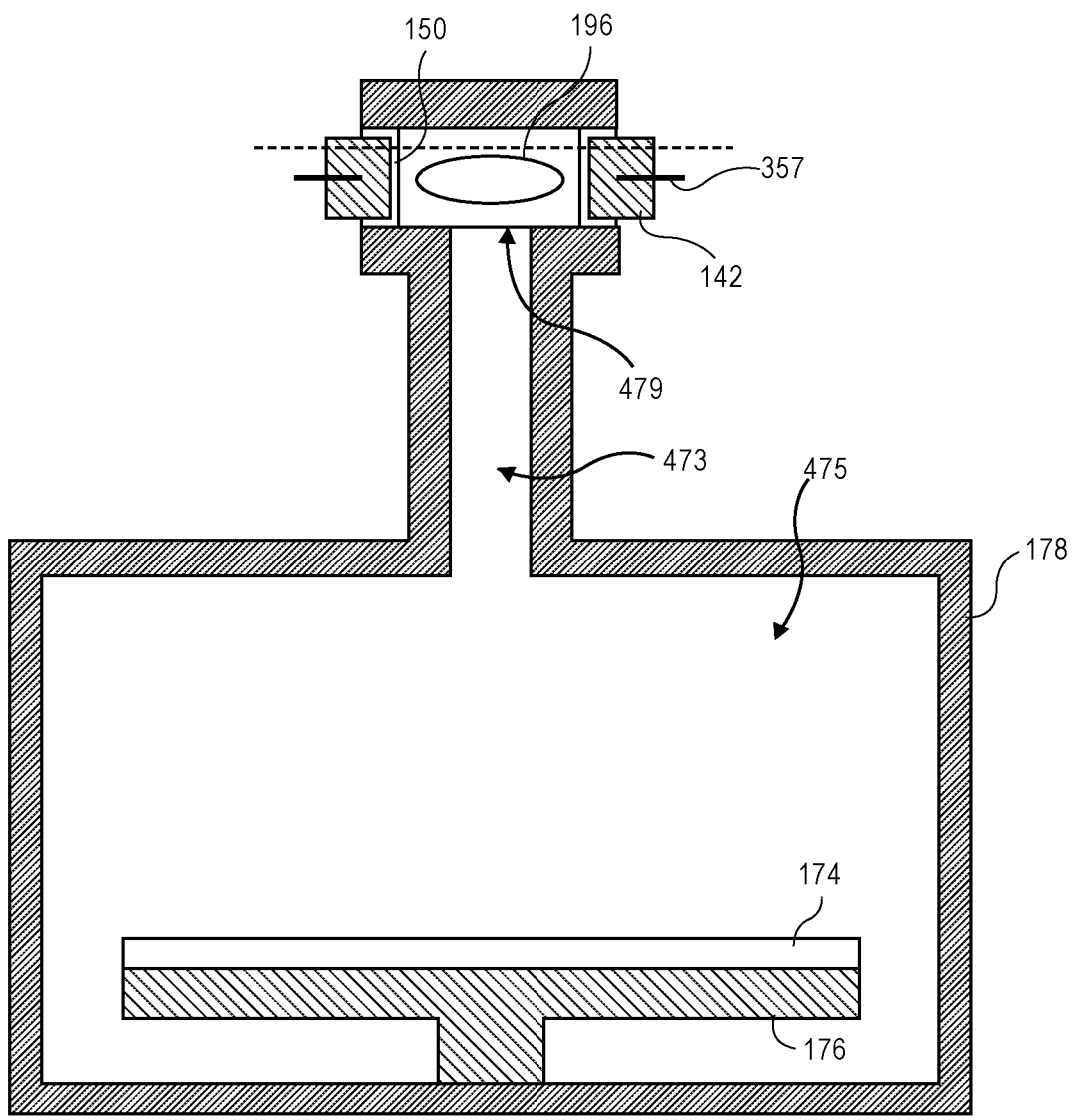
FIG. 4E is a cross-sectional illustration of a remote plasma processing tool that includes a plasma antechamber that is fluidically coupled to the processing chamber of the processing tool, in accordance with an embodiment.
Figure 4F:
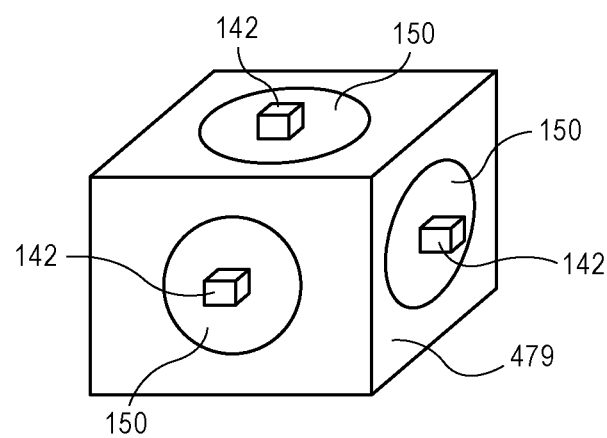
FIG. 4F is a cross-sectional illustration of the dielectric window and applicators located around the antechamber of FIG. 4E, in accordance with an embodiment.

Referring now to FIG. 4E, a cross-sectional illustration of a remote plasma processing tool 400 is shown, in accordance with an embodiment. In an embodiment, the remote plasma processing tool 400 may include an antechamber 479 where the plasma 196 is induced. The antechamber 479 may be defined by sidewalls that comprise a plurality of dielectric windows 150. A perspective view illustration of the antechamber 479 in accordance with an embodiment is shown in FIG. 4F. In the illustrated embodiment, a plurality of dielectric windows 150 are formed on different surfaces of the antechamber 479. While the dielectric windows 150 are shown as circular and the antechamber 479 is cube shaped, it is to be appreciated that the dielectric windows 150 may be other shapes, and the antechamber may be any three-dimensional shape. As shown, the applicators 142 may be configured in a radial orientation around the antechamber 479. In an embodiment, the applicators 142 may rest on an outer surface of the dielectric window 150, the applicators 142 may be inserted into cavities in the dielectric window 150, or the applicators 142 may pass through the dielectric window 150.

In an embodiment, the antechamber 479 may be fluidically connected to a main processing volume 475 of the processing chamber by a pathway 473. In the illustrated embodiment, the antechamber 479 is oriented above the main processing volume 475. However, it is to be appreciated that the antechamber 479 may be positioned in other locations, such as to the side of the main processing volume 475.

Figure 5A:
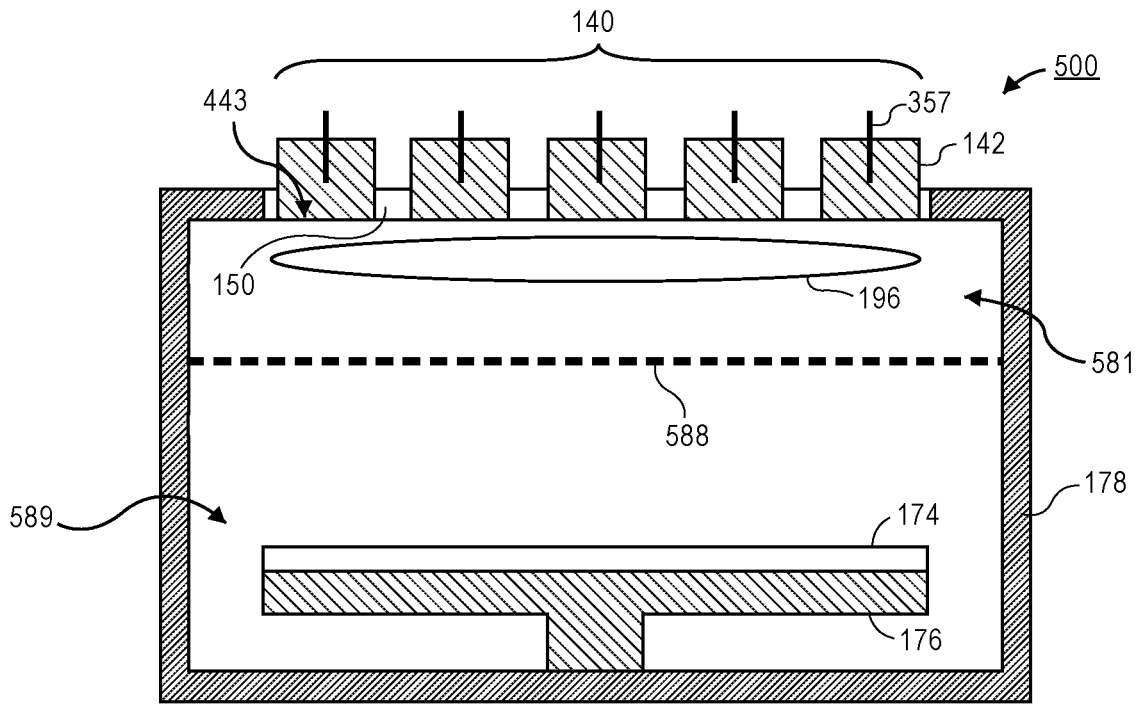
FIG. 5A is a cross-sectional illustration of a plasma processing tool that includes a remote plasma region that is separated from the main processing region by a physical separator, in accordance with an embodiment.
Figure 5B:
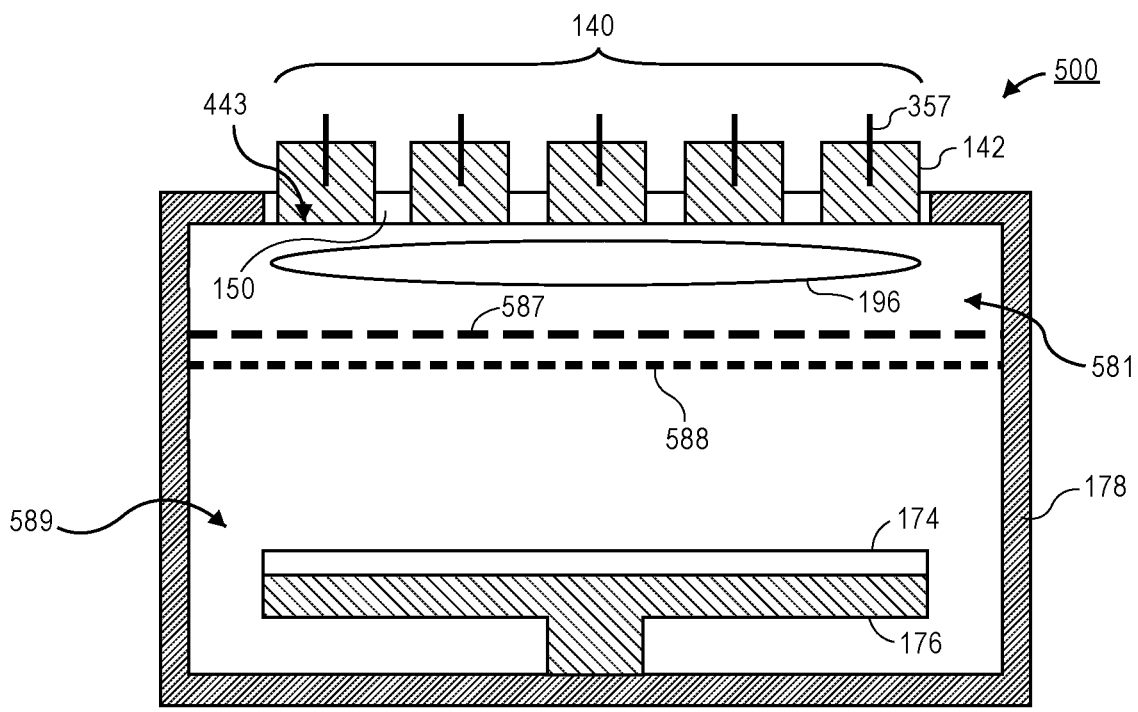
FIG. 5B is a cross-sectional illustration of a plasma processing tool that includes a remote plasma region that is separated from the main processing region by two physical separators, in accordance with an embodiment.
Figure 5C:
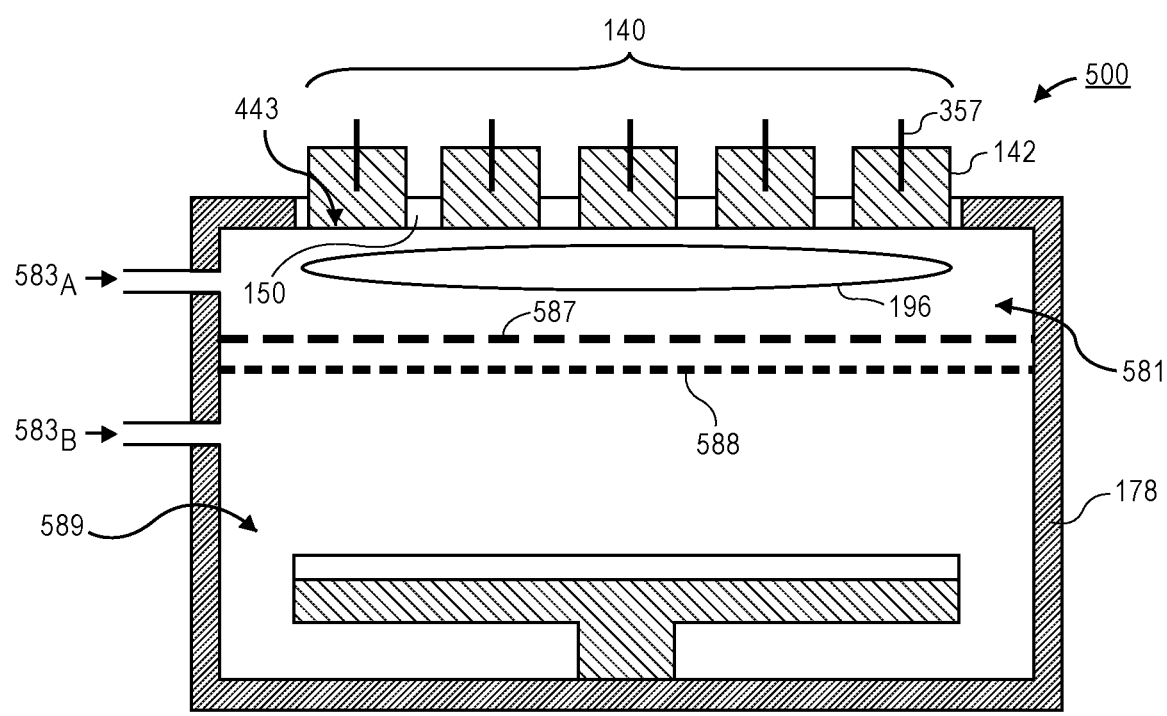
FIG. 5C is a cross-sectional illustration of a plasma processing tool that includes a remote plasma region that is separated from the main processing region by two physical separators and where a first gas line feeds the remote plasma region and a second gas line feeds the main processing region, in accordance with an embodiment.

Referring now to FIGS. 5A-5C, cross-sectional illustrations of remote plasma processing tools 500 are shown in accordance with additional embodiments. In FIGS. 5A-5C, the processing tools 500 are substantially similar to the processing tool 400 illustrated in FIG. 4C with additional features added. However, it is to be appreciated that the additional features described with respect to FIGS. 5A-5C may be incorporated into any of the processing tools described with respect to FIGS. 4A-4F.

Referring now to FIG. 5A, a cross-sectional illustration of a remote plasma processing tool 500 that includes a physical separator 588 is shown, in accordance with an embodiment. In an embodiment, the physical separator 558 may separate a plasma region 581 from the main processing region 589. In an embodiment, the physical separator 588 may be a perforated plate, a mesh, a grid, or the like. In an embodiment, the physical separator 588 may be formed from any suitable material. For example, the physical separator 588 may comprise a metal, an insulator, a semiconductor, or combinations thereof.

In an embodiment, the physical separator 558 may be connected to a power source. In an embodiment, the physical separator 558 may be connected to an RF power source. For example, the physical separator 558 may be connected to an RF power source with a frequency between approximately 0.1 MHz to 200 MHz. In an embodiment, the RF power source may be pulsed. A pulsed RF power source may be operated with a pulsing frequency between 10 Hz and 100,000 Hz. In an embodiment, the power source may be a DC power source or a pulsed DC power source.

In the illustrated embodiment, the physical separator 588 is shown as being substantially planar. However, it is to be appreciated that the physical separator 588 is not limited to the illustrated configuration. For example, the physical separator 588 may include a domed shape or any other planar or non-planar configuration, depending on the needs of the processing tool 500.

Referring now to FIG. 5B, a cross-sectional illustration of a remote plasma processing tool 500 that includes a first separator 588 and a second separator 587 is shown, in accordance with an embodiment. In an embodiment, the first separator 588 and the second separator 587 separate a plasma region 581 of the processing chamber 178 from the main processing region 589. In the illustrated embodiment, there is a gap between the first separator 588 and the second separator 587. However, in some embodiments the first separator 588 and the second separator 587 may contact each other.

In an embodiment, the physical separators 558 and 587 may be a perforated plate, a mesh, a grid, or the like. In an embodiment, the first physical separator 588 may be different than the second physical separator 587. In an embodiment, the first physical separator 588 and the second physical separator 587 may be the same. In an embodiment, the physical separators 588 and 587 may be formed from any suitable material. For example, the physical separators 588 and 587 may comprise a metal, an insulator, a semiconductor, or combinations thereof.

In an embodiment, one or both of the first and second separators 588 and 587 are connected to a power source. In some embodiments, the first and second separators 588 and 587 may be connected to different power sources. In an embodiment, the power source or power sources may include an RF power source, a pulsed RF power source, a DC power source, or a pulsed DC power source. In an embodiment, and RF power source may operate at a frequency between approximately 0.1 MHz to 200 MHz. In an embodiment, the RF power source may be pulsed. A pulsed RF power source may be operated with a pulsing frequency between 10 Hz and 100,000 Hz.

In the illustrated embodiment, the physical separators 588 and 587 are shown as being substantially planar. However, it is to be appreciated that the physical separators 588 and 587 are not limited to the illustrated configuration. For example, one or both of the physical separators 588 and 587 may include a domed shape or any other planar or non-planar configuration, depending on the needs of the processing tool 500. Furthermore, while two physical separators 588 and 587 are illustrated, it is to be appreciated that embodiments may include any number of physical separators.

Referring now to FIG. 5C, a cross-sectional illustration of a remote plasma processing tool 500 with a first gas line 583A and a second gas line 583B is shown, in accordance with an embodiment. In an embodiment, a first gas line 583A may feed a first gas or gas mixture into the plasma region 581 of the processing chamber 178. In an embodiment, a second gas line 583B may be located below the first and second separators 588 and 587 and may feed a second gas or gas mixture into the main processing region 589 of the processing chamber 178. In an embodiment, the second gas line 583B may be integrated into one or both of the physical separators 588 and/or 587.

Figure 6A:
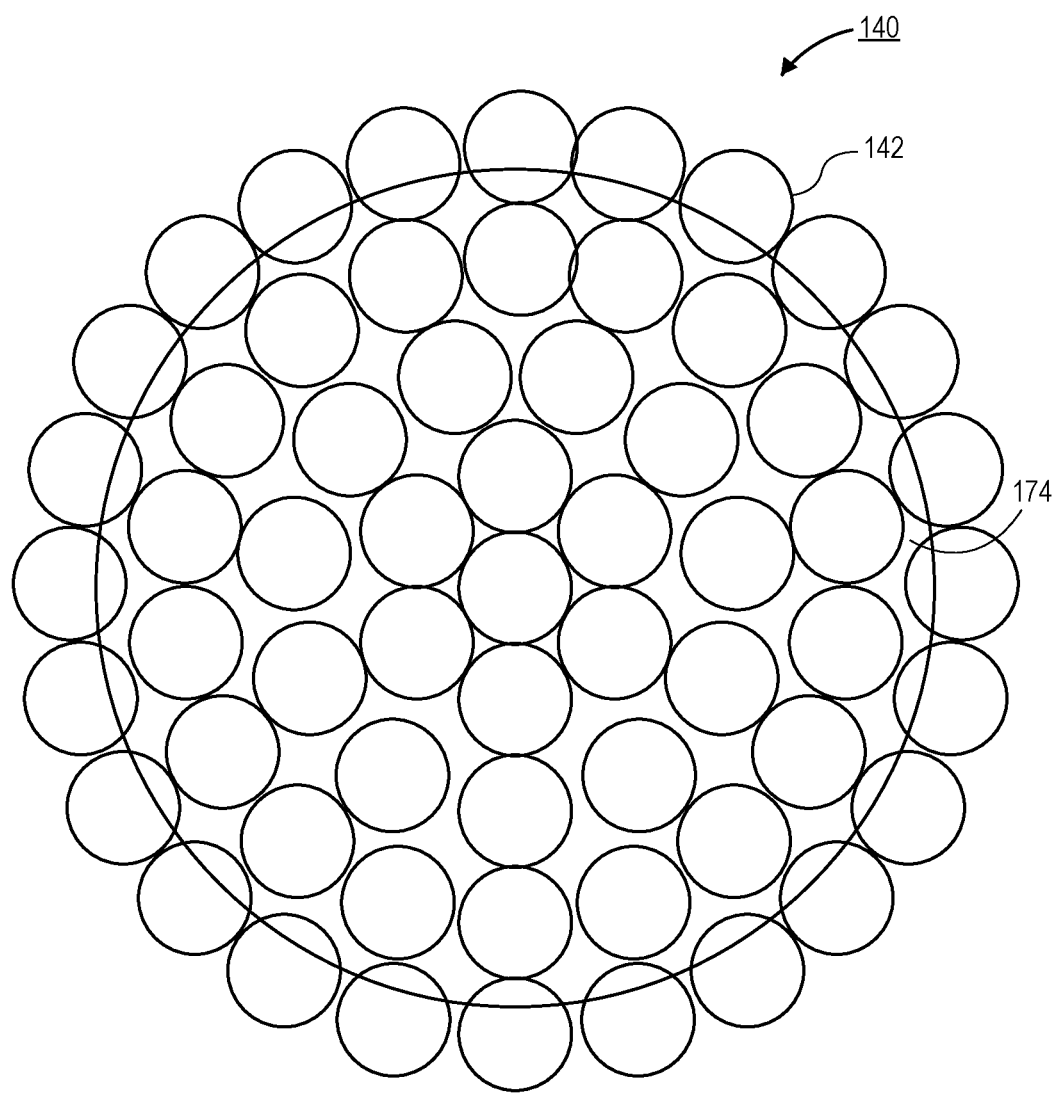
FIG. 6A is a plan view of an array of applicators that may be used to couple high-frequency radiation to a processing chamber, in accordance with an embodiment.

As noted above, an array 140 of applicators 142 may be arranged so that they provide coverage of an arbitrarily shaped substrate 174. FIG. 6A is a plan view illustration of an array 140 of applicators 142 that are arranged in a pattern that matches a circular substrate 174. By forming a plurality of applicators 142 in a pattern that roughly matches the shape of the substrate 174, the plasma becomes tunable over the entire surface of the substrate 174. For example, each of the applicators 142 may be controlled so that a plasma with a uniform plasma density across the entire surface of the substrate 174 is formed. Alternatively, one or more of the applicators 142 may be independently controlled to provide plasma densities that are variable across the surface of the substrate 174. As such, incoming nonuniformity present on the substrate may be corrected. For example, the applicators 142 proximate to an outer perimeter of the substrate 174 may be controlled to have a different power density than applicators proximate to the center of the substrate 174. Furthermore, it is to be appreciated that the use of high-frequency emission modules 105 that emit incoherent electromagnetic radiation (as described above) allows for the elimination of standing waves and/or unwanted interference patterns.

In FIG. 6A, the applicators 142 in the array 140 are packed together in a series of concentric rings that extend out from the center of the substrate 174. However, embodiments are not limited to such configurations, and any suitable spacing and/or pattern may be used depending on the needs of the processing tool 100. Furthermore, embodiments allow for applicators 142 with any symmetrical cross-section, as described above. Accordingly, the cross-sectional shape chosen for the applicator may be chosen to provide enhanced packing efficiency.

Figure 6B:
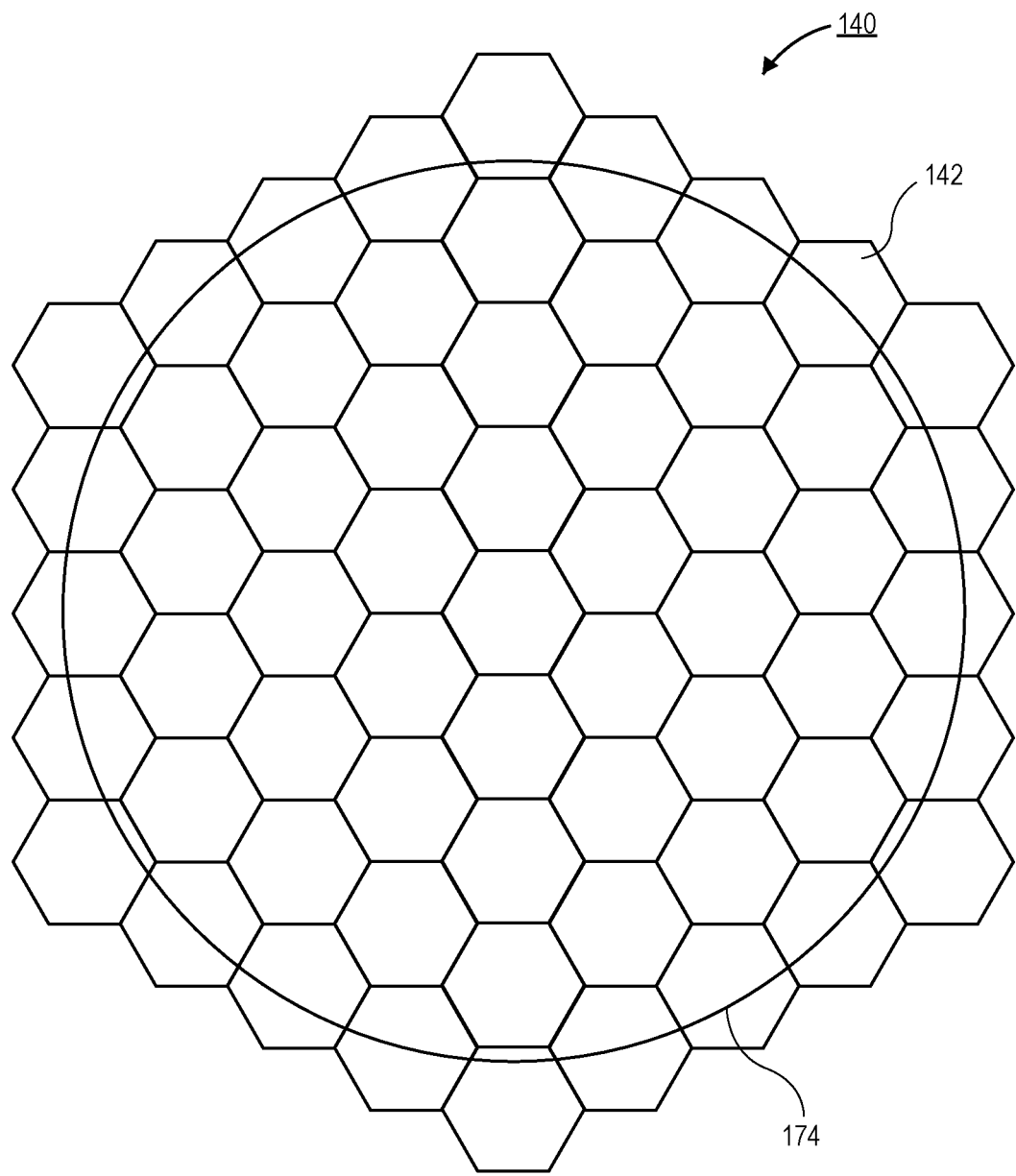
FIG. 6B is a plan view of an array of applicators that may be used to couple high-frequency radiation to a processing chamber, in accordance with an additional embodiment.

Referring now to FIG. 6B, a plan view of an array 140 of applicators 142 with a non-circular cross-section is shown, according to an embodiment. The illustrated embodiment includes applicators 142 that have hexagonal cross-sections. The use of such an applicator may allow for improved packing efficiency because the perimeter of each applicator 142 may mate nearly perfectly with neighboring applicators 142. Accordingly, the uniformity of the plasma may be enhanced even further since the spacing between each of the applicators 142 may be minimized. While FIG. 6B illustrates neighboring applicators 142 sharing sidewall surfaces, it is to be appreciated that embodiments may also include non-circular symmetrically shaped applicators that include spacing between neighboring applicators 142.

Figure 6C:
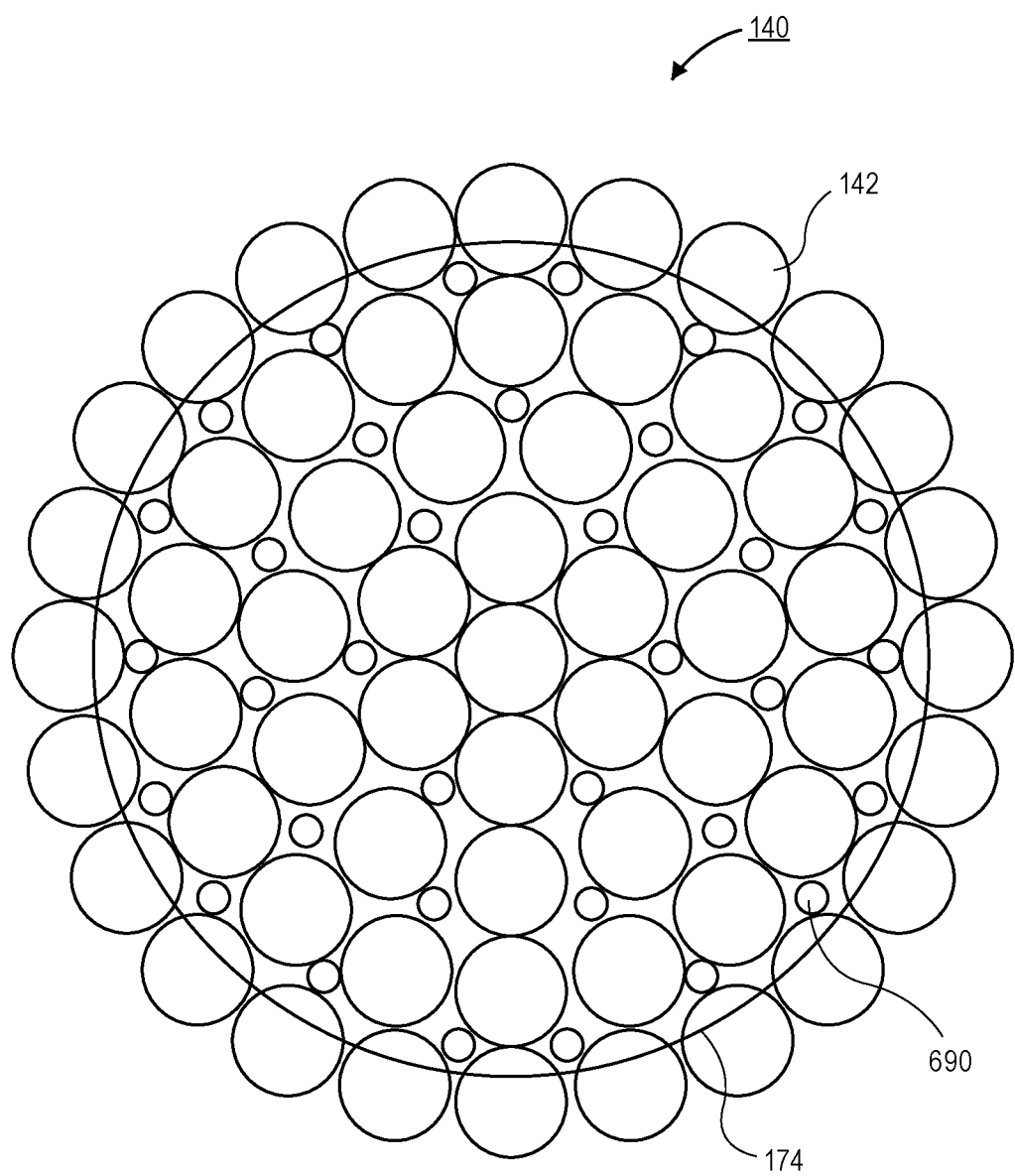
FIG. 6C is a plan view of an array of applicators and a plurality of sensors for detecting conditions of a plasma, in accordance with an embodiment.

Referring now to FIG. 6C, an additional plan-view illustration of an array 140 of applicators 142 is shown according to an embodiment. The array 140 in FIG. 6C is substantially similar to the array 140 described above with respect to FIG. 6A, except that a plurality of sensors 690 are also included. The plurality of sensors provides improved process monitoring capabilities that may be used to provide additional feedback control of each of the modular high-frequency sources 104. In an embodiment, the sensors 690 may include one or more different sensor 690 types, such as plasma density sensors, plasma emission sensors, or the like. Positioning the sensors across the surface of the substrate 174 allows for the plasma properties at given locations of the processing chamber 178 to be monitored.

According to an embodiment, every applicator 142 may be paired with a different sensor 690. In such embodiments, the output from each sensor 690 may be used to provide feedback control for the respective applicator 142 to which the sensor 690 has been paired. Additional embodiments may include pairing each sensor 690 with a plurality of applicators 142. For example, each sensor 690 may provide feedback control for multiple applicators 142 to which the sensor 690 is proximately located. In yet another embodiment, feedback from the plurality of sensors 690 may be used as a part of a multi-input multi-output (MIMO) control system. In such an embodiment, each applicator 142 may be adjusted based on feedback from multiple sensors 690. For example, a first sensor 690 that is a direct neighbor to a first applicator 142 may be weighted to provide a control effort to the first applicator 142 that is greater than the control effort exerted on the first applicator 142 by a second sensor 690 that is located further from the first applicator 142 than the first sensor 690.

Figure 6D:
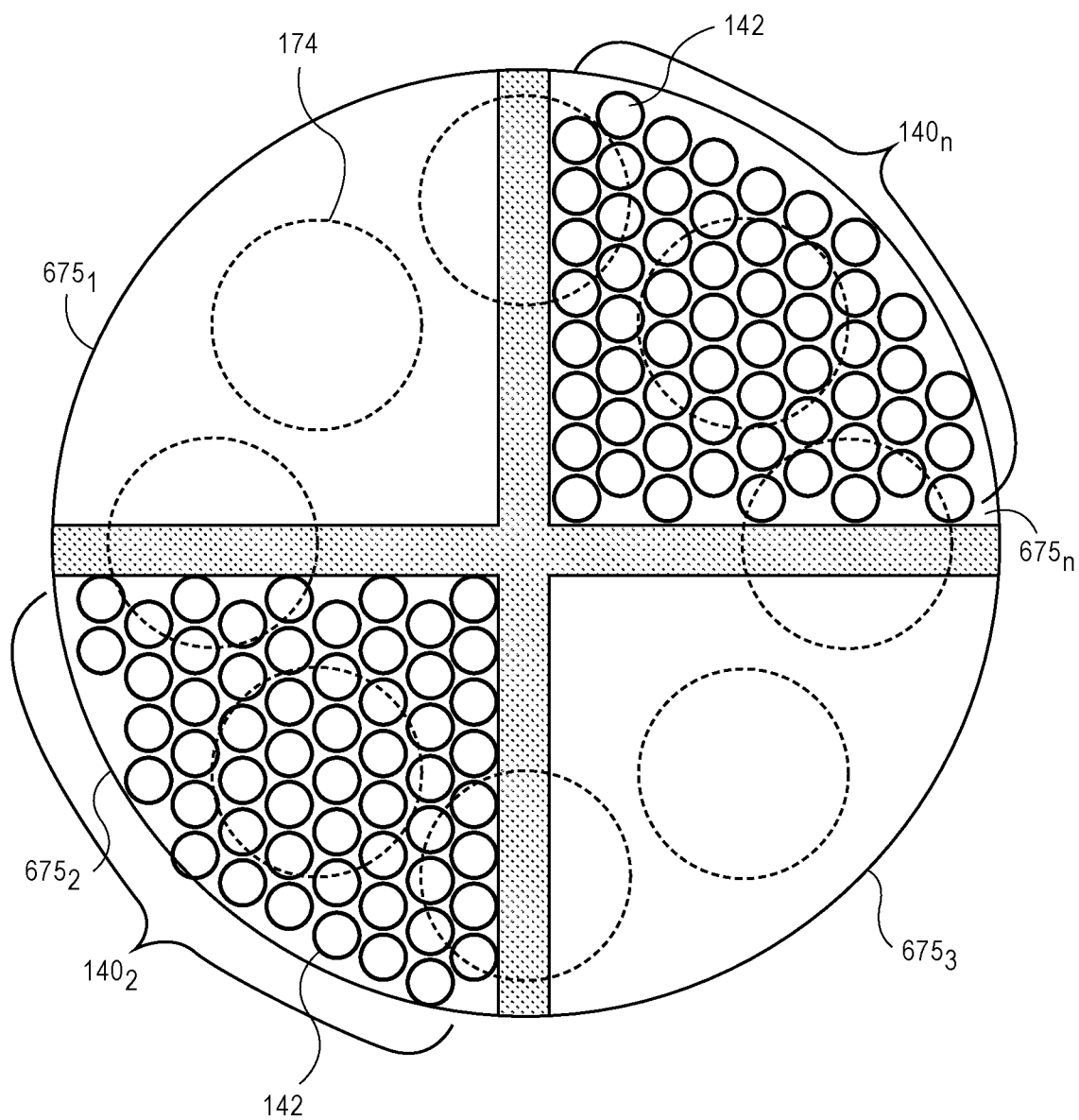
FIG. 6D is a plan view of an array of applicators that are formed in two zones of a multi-zone processing tool, in accordance with an embodiment.

Referring now to FIG. 6D, an additional plan-view illustration of an array 140 of applicators 142 positioned in a multi-zone processing tool 100 is shown, according to an embodiment. In an embodiment, the multi-zone processing tool 100 may include any number of zones. For example, the illustrated embodiment includes zones $675_1$-$675_n$. Each zone 675 may be configured to perform different processing operations on substrates 174 that are rotated through the different zones 675. As illustrated, a first array 140₂ is positioned in zone 675₂ and a second array 140ₙ is positioned in zone 675ₙ. However, embodiments may include multi-zone processing tools 100 with an array 140 of applicators 142 in one or more of the different zones 675, depending on the needs of the device. The spatially tunable density of the plasma provided by embodiments allows for the accommodation of nonuniform radial velocity of the rotating substrates 174 as they pass through the different zones 675.

In an embodiment, the ratio of oscillator modules 106 to applicators 142 may be 1:1 (i.e., every applicator 142 is coupled to a different oscillator module 106). In additional embodiments, the ratio of oscillator modules 106 to applicators 142 may be 1:2, 1:3, 1:4, etc. For example, in embodiments that include two arrays of applicators 1402 and 140n, each oscillator module 106 may be coupled to a first applicator 142 in the first array 1402 and to a second applicator 142 in the second array 140n.

Figure 7:
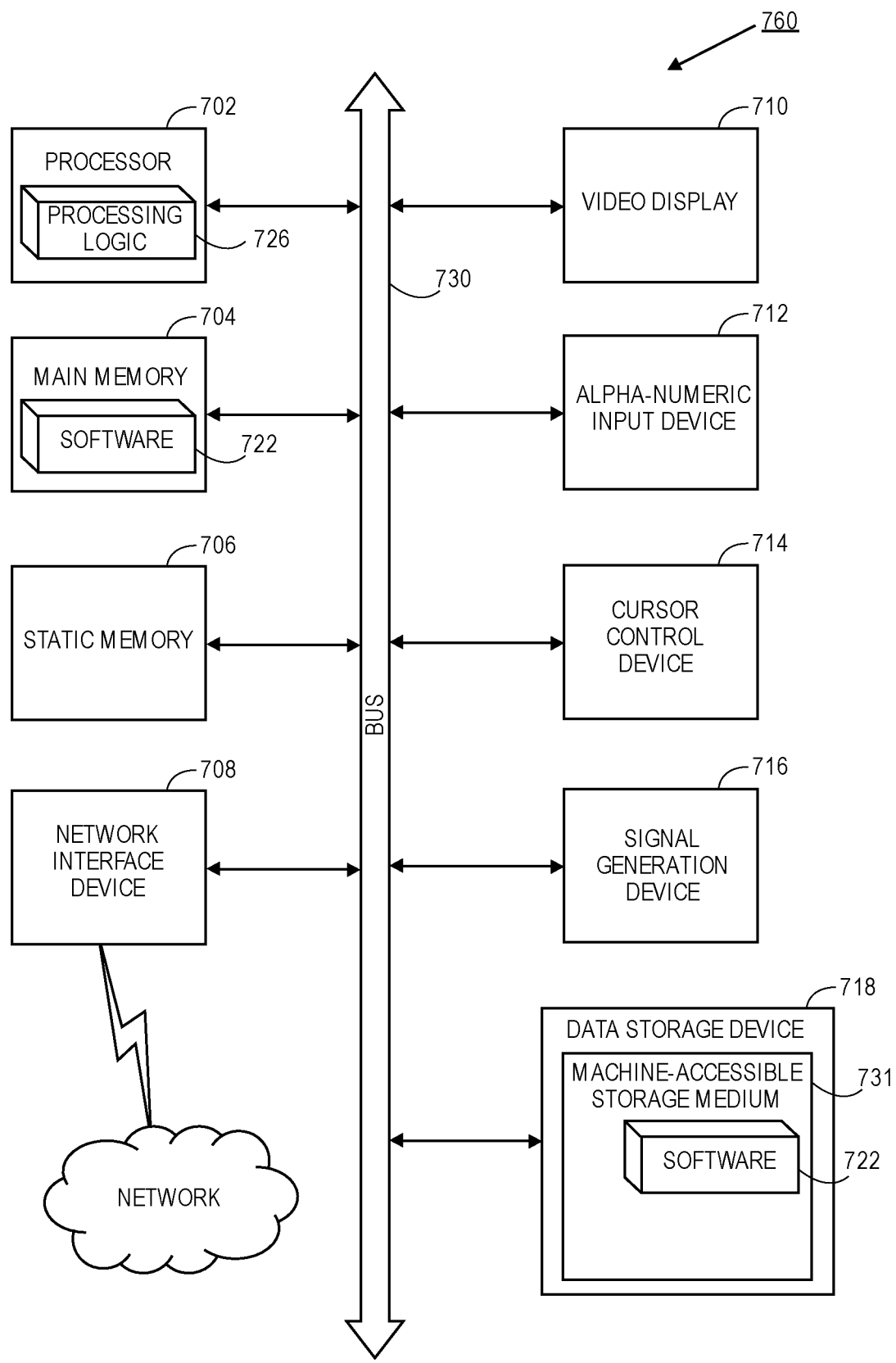
FIG. 7 illustrates a block diagram of an exemplary computer system that may be used in conjunction with a modular high-frequency radiation source, in accordance with an embodiment.

Referring now to FIG. 7, a block diagram of an exemplary computer system 760 of a processing tool 100 is illustrated in accordance with an embodiment. In an embodiment, computer system 760 is coupled to and controls processing in the processing tool 100. Computer system 760 may be connected (e.g., networked) to other machines in a Local Area Network (LAN), an intranet, an extranet, or the Internet. Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 720 via the system network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A processing tool, comprising:
   a processing chamber;
   a chuck for supporting a substrate in the processing chamber, the chuck having a lateral width;
   a dielectric window forming a portion of the processing chamber, the dielectric window continuous across an entirety of the lateral width of the chuck; and
   a modular high-frequency emission source, comprising:
   a plurality of high-frequency emission modules, wherein each high-frequency emission module comprises:
      an oscillator module;
      an amplification module, wherein the amplification module is coupled to the oscillator module; and
      an applicator, wherein the applicator is coupled to the amplification module, wherein the applicator is set into a cavity formed into the dielectric window, wherein a bottom surface of the applicator is entirely covered by a surface of the dielectric window, and wherein the applicator comprises:
         a dielectric resonant cavity, wherein the dielectric resonant cavity is in contact with the dielectric window; and a monopole antenna extending into the dielectric resonant cavity.

2. The processing tool of claim 1, wherein the applicators rest on the surface of the dielectric window.

3. The processing tool of claim 1, wherein the dielectric window is non-planar.

4. The processing tool of claim 3, wherein the dielectric window is domed shaped.

5. The processing tool of claim 1, wherein the dielectric window forms a portion of an antechamber that is fluidically coupled to the processing chamber.

6. The processing tool of claim 1, further comprising:
a first physical separator that separates a plasma portion of the processing chamber from a main processing portion of the processing chamber.

7. The processing tool of claim 6, further comprising a second physical separator.

8. The processing tool of claim 7, wherein the first physical separator or the second physical separator, or the first physical separator and the second physical separator are connected to a power source.

9. The processing tool of claim 8, wherein the power sources comprise one or more of an RF power source, a pulsed RF power source, a DC power source, or a pulsed DC power source.

10. The processing tool of claim 6, wherein a first gas line feeds a first gas or gas mixture into the plasma portion of the processing chamber, and wherein a second gas line feeds a second gas or gas mixture into the main processing portion of the processing chamber.

11. The processing tool of claim 6, wherein the physical separator comprises one or more of a perforated plate, a mesh, or a grid.

12. The processing tool of claim 11, wherein the physical separator comprises one or more of a metal, and insulator, or a semiconductor.

13. A processing tool, comprising:
a processing chamber;
a chuck for supporting a substrate in the processing chamber, the chuck having a lateral width;
a dielectric window forming a portion of the processing chamber, the dielectric window continuous across an entirety of the lateral width of the chuck; and
a modular high-frequency emission source, comprising:
a plurality of high-frequency emission modules, wherein each high-frequency emission module comprises:
an oscillator module, wherein the oscillator module comprises:
a voltage control circuit; and
a voltage controlled oscillator, wherein an output voltage from the voltage control circuit drives oscillation in the voltage controlled oscillator to generate an output high-frequency electromagnetic radiation;
an amplification module, wherein the amplification module is coupled to the oscillator module, wherein the amplification module amplifies the output high-frequency electromagnetic radiation from the voltage controlled oscillator; and
an applicator, wherein the applicator is coupled to the amplification module, wherein the applicator is set into a cavity formed into the dielectric window, wherein a bottom surface of the applicator is entirely covered by a surface of the dielectric window, and wherein the applicator comprises:
a dielectric resonant cavity, wherein the dielectric resonant cavity is in contact with the dielectric window; and
a monopole antenna extending into the dielectric resonant cavity.

14. The processing tool of claim 13, wherein the applicators are on, in, or through the dielectric window.

15. The processing tool of claim 13, further comprising a physical separator.

* * * * *